US012249393B2

(12) United States Patent
Reohr

(10) Patent No.: US 12,249,393 B2
(45) Date of Patent: Mar. 11, 2025

(54) SUPERCONDUCTING DISTRIBUTED BIDIRECTIONAL CURRENT DRIVER SYSTEM

(71) Applicant: William Robert Reohr, Severna Park, MD (US)

(72) Inventor: William Robert Reohr, Severna Park, MD (US)

( * ) Notice: Subject to any disclaimer, the term of this patent is extended or adjusted under 35 U.S.C. 154(b) by 289 days.

(21) Appl. No.: 17/993,586

(22) Filed: Nov. 23, 2022

(65) Prior Publication Data

US 2024/0005986 A1 Jan. 4, 2024

Related U.S. Application Data

(60) Provisional application No. 63/322,694, filed on Mar. 23, 2022, provisional application No. 63/282,844, filed on Nov. 24, 2021.

(51) Int. Cl.
| | | |
|---|---|---|
| *G11C 7/12* | (2006.01) | |
| *G11C 7/10* | (2006.01) | |
| *G11C 11/44* | (2006.01) | |
| *H03K 3/38* | (2006.01) | |
| *H03K 19/195* | (2006.01) | |

(52) U.S. Cl.
CPC .......... *G11C 7/1066* (2013.01); *G11C 7/1063* (2013.01); *G11C 7/1096* (2013.01); *G11C 7/12* (2013.01); *G11C 11/44* (2013.01); *H03K 3/38* (2013.01); *H03K 19/1952* (2013.01)

(58) Field of Classification Search
CPC ... G11C 7/1066; G11C 7/1063; G11C 7/1096; G11C 7/12; G11C 11/44; G11C 5/063; G11C 7/1093; H03K 3/38; H03K 19/1952
See application file for complete search history.

(56) References Cited

U.S. PATENT DOCUMENTS

| | | | | |
|---|---|---|---|---|
| 5,504,699 | A * | 4/1996 | Goller | G11B 23/0042 |
| | | | | 365/48 |
| 10,122,351 | B1 * | 11/2018 | Naaman | G06N 10/00 |
| 2019/0036515 | A1 * | 1/2019 | Naaman | G06N 10/00 |
| 2023/0136455 | A1 * | 5/2023 | Reohr | G11C 11/161 |
| | | | | 365/162 |
| 2024/0005968 | A1 * | 1/2024 | Reohr | G11C 7/12 |

\* cited by examiner

*Primary Examiner* — Jay W. Radke
(74) *Attorney, Agent, or Firm* — Myers Bigel, P.A.

(57) ABSTRACT

A superconducting distributed bidirectional current driver system includes multiple bidirectional current drivers, a bidirectional current load being operatively coupled between two adjacent bidirectional current drivers. Each of the bidirectional current drivers includes first and second superconducting latch circuits. The first superconducting latch circuit in a first one of the bidirectional current drivers and the second superconducting latch circuit in a second one of the bidirectional current drivers coupled to the current load are selectively activated by first and second activation signals, respectively, to establish a first current path through the current load in a first direction. The second superconducting latch circuit in the second one of the bidirectional current drivers and the first superconducting latch circuit in the first one of the bidirectional current drivers are selectively activated to establish a second current path through the current load in a second direction opposite the first direction.

14 Claims, 13 Drawing Sheets

SUPERCONDUCTING DISTRIBUTED BIDIRECTIONAL CURRENT DRIVER SYSTEM

CROSS-REFERENCE TO RELATED APPLICATIONS

This application claims the benefit of and priority to U.S. Provisional Patent Application No. 63/282,844, filed Nov. 24, 2021, entitled "Buses and Support Circuitry for Reading and Writing Memory Cells within Superconducting Memory Systems," and U.S. Provisional Patent Application No. 63/322,694, filed Mar. 23, 2022, entitled "Control Logic, Buses, Memory and Support Circuitry for Reading and Writing Large Capacity Memories Within Superconducting Systems," the disclosures of which are incorporated by reference herein in their entirety for all purposes.

BACKGROUND

This disclosure relates generally to quantum and classical circuit systems, and specifically to a superconducting distributed bidirectional current driver system.

Superconducting digital technology has provided computing and/or communications resources that benefit from unprecedented high speed, low power dissipation, and low operating temperature. Superconducting digital technology has been developed as an alternative to CMOS technology, and typically comprises superconductor based single flux quantum superconducting circuitry, utilizing superconducting Josephson junctions, and can exhibit typical signal power of around 4 nW (nanowatts) at a typical data rate of 20 Gb/s (gigabytes/second) or greater, and can operate at temperatures of around 4 Kelvin. Superconducting circuits in a variety of applications, such as memory and quantum processors, can require a current to be applied to certain load devices (e.g., an inductor) in the circuit for a certain amount of time. For example, in a memory circuit, the current can be applied as a "write" signal applied to a bit or word write line, in quantum information the current can be a flux bias signal to a qubit, or in other superconducting applications, the current may be a programming or enable line. In some such applications, the applied current may be required to be bidirectional.

SUMMARY

The present invention, as manifested in one or more embodiments, addresses the above-identified problems and disadvantages, among other benefits, by providing both general and tailored solutions for a variety of memory types (e.g., JMRAM). In addition, analog superconducting circuits for generating a bidirectional write current are described, primarily because they are important to the JMRAM write operation and potentially important for other analog applications as well.

Without significantly disrupting core circuits of standard JMRAM, such as memory cells, write circuits (e.g., flux pumps), and read circuits (e.g., sense amplifiers), devised over the past several years since its first technology demonstrations in a paper entitled "Magnetic Josephson Junctions with Superconducting Interlayer for Cryogenic Memory," by Igor Vernik et. al., IEEE Transactions on Applied Superconductivity, Vol. 23, Issue 3, Dec. 10, 2012, which is incorporated by reference herein in its entirety, embodiments of the present invention beneficially describe fundamental alternatives to increase/maximize the overall bit density of the memory and, moreover, provide solutions to address fundamental circuit and device problems associated with conventional JMRAM technology, all while achieving greater levels of circuit operability and reliability (e.g., write selectivity).

In accordance with one embodiment, a superconducting distributed bidirectional current driver system for selectively steering current in one of first and second directions through at least one bidirectional current load includes multiple bidirectional current drivers, at least one bidirectional current load being operatively coupled between two adjacent bidirectional current drivers. Each of the bidirectional current drivers includes a first superconducting latch circuit configured to convey current through the bidirectional current load as a function of at least a first activation signal applied thereto, and a second superconducting latch circuit configured to convey current through a bidirectional current load associated with an adjacent one of the bidirectional current drivers as a function of a second activation signal applied thereto. The first superconducting latch circuit in a first one of the bidirectional current drivers operatively coupled to the bidirectional current load and the second superconducting latch circuit in a second one of the bidirectional current drivers operatively coupled to the bidirectional current load are selectively activated by the first and second activation signals, respectively, to establish a first current path of a first input current supplied to the first one of the bidirectional current drivers, through the bidirectional current load in a first direction. The second superconducting latch circuit in the second one of the bidirectional current drivers operatively coupled to the bidirectional current load and the first superconducting latch circuit in the first one of the bidirectional current drivers operatively coupled to the bidirectional current load are selectively activated by the second and first activation signals, respectively, to establish a second current path of a second input current supplied to the second one of the bidirectional current drivers, through the bidirectional current load in a second direction opposite the first direction.

As the term may be used herein, "facilitating" an action includes performing the action, making the action easier, helping to carry the action out, or causing the action to be performed. Thus, by way of example only and without limitation, in the context of a processor-implemented method, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and configured to perform the exemplary method steps.

Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media)

and implemented on a hardware processor, or (iii) a combination of (i) and (ii); any of (i)-(iii) implement the specific techniques, or elements thereof, set forth herein.

Techniques according to embodiments of the present invention are directed toward a technological improvement, or toward a solution to a technological problem, that can provide substantial beneficial technical effects. By way of example only and without limitation, techniques according to embodiments of the invention provide one or more of the following advantages:

enhances writing of magnetic memory cells in an array of superconducting magnetic memory cells;

reduces the area of a plurality of such magnetic memory cells and their support circuits, among other benefits; and can provide flux biases to a set of qubits.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
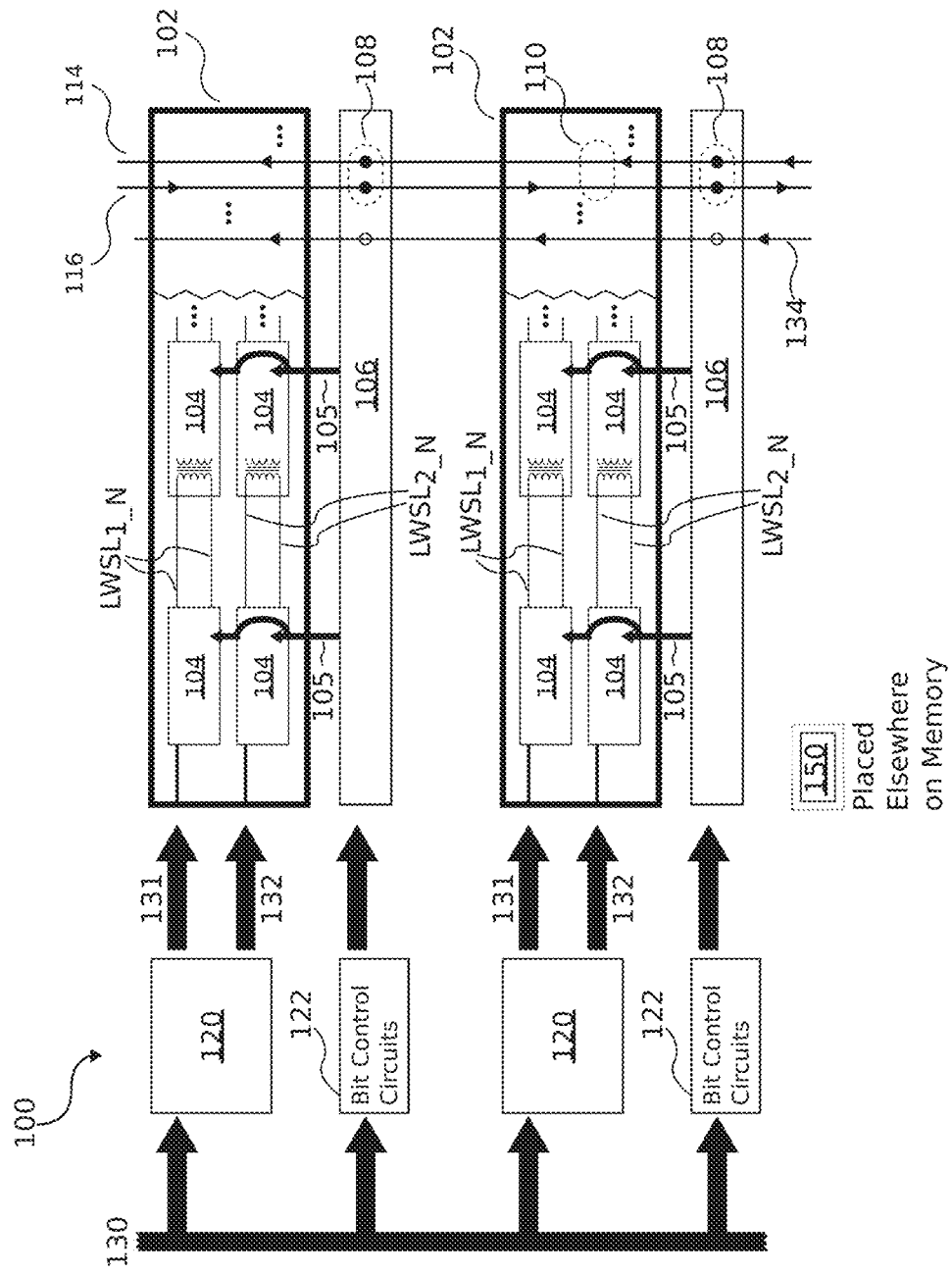
FIG. 1 is a schematic diagram depicting at least a portion of a first exemplary superconducting memory system, exclusively JMRAM-based, according to one or more embodiments of the present invention.

It is to be appreciated that elements in the figures are illustrated for simplicity and clarity. Common but well-understood elements that may be useful or necessary in a commercially feasible embodiment are not necessarily shown in order to facilitate a less hindered view of the illustrated embodiments.

DETAILED DESCRIPTION

Principles of the present invention, as manifested in one or more embodiments, will be described herein in the context of quantum and classical digital superconducting circuits, and specifically various embodiments of superconducting distributed bidirectional current drivers for use in reading and writing Josephson magnetic random access memory (JMRAM) memory cells in a superconducting memory system. It is to be appreciated, however, that the invention is not limited to the specific device(s), circuit(s) and/or method(s) illustratively shown and described herein. Rather, it will become apparent to those skilled in the art given the teachings herein that numerous modifications are contemplated that can be made to the embodiments shown and are within the scope of the claimed invention. That is, no limitations with respect to the embodiments shown and described herein are intended or should be inferred.

In general, microwave signals, such as, for example, single flux quantum (SFQ) pulses, may be used to control the state of a memory cell in a memory array. During read/write operations, word-lines and bit-lines may be selectively activated by SFQ pulses, or reciprocal quantum logic (RQL) pulses arriving via an address bus and via independent read and write control signals. These pulses may, in turn, control word-line and bit-line driver circuits adapted to selectively provide respective word-line and bit-line currents to the relevant memory cells in the memory array.

A JMRAM system can implement an array of JMRAM memory cells that each includes a phase hysteretic magnetic Josephson junction (MJJ) that can be configured as comprising ferromagnetic materials in an associated barrier. As an example, the MJJ can be configured as a junction switchable between a zero state and a 7r-state that is configured to generate a superconducting phase based on the digital state stored therein. The JMRAM memory cells can also each include at least one Josephson junction (e.g., a pair of Josephson junctions in parallel with the MJJ). The basic element in SFQ, RQL, and JMRAM circuits is the Josephson junction, which emits a voltage-time spike with an integrated amplitude equal to the flux quantum ($\varphi_0=2.07\times 10^{-15}$V·s) when the current through the Josephson junction exceeds a critical current, wherein the developed voltage opposes the current flow.

Illustrative embodiments of the present invention are beneficially suitable for use with conventional MJJs (e.g., of conventional memory cells) switched/written (i) exclusively with magnetic fields, and (ii) with a combination of a magnetic field selection and phase-based torque.

The MJJ in each of the JMRAM memory cells can store a digital state corresponding to one of a first binary state (e.g., logic-1) or a second binary state (e.g., logic-0) in response to a write-word current and a write-bit current associated with the MJJ. For example, the first binary state can correspond to a positive $\pi$-state, in which a superconducting phase is exhibited. As an example, the write-word and write-bit currents can each be provided on an associated (e.g., coupled to the MJJ) write-word line (WWL) and an associated write-bit line (WBL) and together can set the logic state of a selected MJJ. As the term is used herein, a "selected" MJJ is defined as a MJJ selected for writing among a plurality of MJJs by activating current flow in its associated write-bit line WBL. Its digital state is written by a positive or negative current flow within its associated write-bit line (for all known/postulated MJJs except a "toggle" MJJ). Moreover, to prevent the MJJ being set to an undesired negative $\pi$-state, the MJJ may include a directional write element that is configured to generate a directional bias current through the MJJ during a data-write operation. Thus, the MJJ can be forced into the positive $\pi$-state to provide the superconducting phase in a predetermined direction.

In addition, the MJJ in each of the JMRAM memory cells in the array can provide an indication of the stored digital state in response to a read-word current and a read-bit current. The superconducting phase can thus lower a critical current associated with at least one Josephson junction of each of the JMRAM memory cells of a row in the array. Therefore, the read-bit current and a derivative of the read-word current (induced by the read-word current flowing through a transformer) can be provided, in combination, (i) to trigger the Josephson junction(s) to change a voltage on an associated read-bit line if the MJJ stores a digital state corresponding to the first binary state, and (ii) not to trigger if the MJJ stores a digital state corresponding to the second binary state. Thus, the read-bit line can have a voltage present the magnitude of which varies based on whether the digital state of the MJJ corresponds to the binary logic-1 state or the binary logic-0 state (e.g., between a non-zero and a zero amplitude). As used herein, the term "trigger" with respect to Josephson junctions is intended to describe the phenomenon of the Josephson junction generating a discrete voltage pulse in response to current flow through the Josephson junction exceeding a prescribed critical current level.

As previously stated, aspects of the present disclosure provide superconducting distributed bidirectional current drivers for use in writing JMRAM memory cells. In accordance with one or more embodiments of the invention, a superconducting distributed current driver is configured to provide at least one current in a first direction or a second direction through at least one bidirectional current load. By way of example only and without limitation or loss of generality, the bidirectional current load can be configured as an inductive load, such that the inductive load is inductively coupled to or otherwise corresponds to a write bit line in a memory system to write a first logic state in a memory cell based on current flowing in the first direction through the inductive load, and to write a second logic state in the memory cell based on the current flowing in the second direction through the inductive load.

A superconducting bidirectional current driver according to one or more embodiments of the invention beneficially includes a plurality of superconducting latches that are selectively activated to provide separate current paths through the bidirectional current load, at any one activated time, for one of at least two input currents. For example, while in a first active mode, when current is actually flowing through at least one bidirectional current load, a first current, corresponding to a first of the two input currents, passes through a non-activated superconducting latch and through the bidirectional current load following a first direction. Similarly, while in a second active mode, when current is actually flowing through the bidirectional current load, a second current, corresponding to a second of the two input currents, passes through the non-activated superconducting latch and through the bidirectional current load following a second direction which is opposite the first direction.

It is to be appreciated that a superconducting latch, as the term is used throughout the present disclosure, is not equivalent to a latch formed of standard logic gates and circuits. Rather, each of the superconducting latches used in accordance with embodiments of the invention is configured as a quantum flux device (e.g., a superconducting quantum interface device (SQUID) or a Josephson junction (JJ) device) that is activated to switch a voltage state. Activation of the superconducting latches, which steer the bidirectional write current, can be performed via activation signals provided from at least two distributed activation controllers, wherein each distributed activation controller is proximate to the corresponding superconducting latch(es) that it drives. Thus, in response to being switched to its voltage state, the superconducting latch functions as a resistive element by diverting current from flowing through it. Therefore, the superconducting distributed bidirectional current driver according to aspects of the present invention advantageously steers current through the bidirectional current load based primarily on selective activation of the superconducting latches included in the driver. For example, the superconducting distributed bidirectional current driver, in accordance with one or more embodiments, can be configured as an H-bridge circuit that includes complementary pairs of superconducting latches that are activated to selectively steer the input current through the bidirectional current load in the respective first and second directions.

FIG. 1 is a block diagram conceptually depicting at least a portion of a first illustrative superconducting memory system 100, according to one or more embodiments of the invention. Specifically, the memory system 100 includes a plurality of memory arrays 102, wherein each array includes a plurality of memory cell write groups (MCWGs) 104. The pseudo floorplan and schematic of the memory system 100 shown in FIG. 1 illustrates the use of memory cell write groups 104, which are described in U.S. patent application Ser. No. 17/976,179 by W. Reohr, filed on Oct. 28, 2022 and entitled "Read and Write Enhancements for Arrays of Superconducting Magnetic Memory Cells," the disclosure of which is incorporated by reference herein in its entirety for all purposes. Each memory cell write group 104 includes memory cells, a write select circuit, and local write select lines LWSL(s). With the exception of LWSL connections, FIG. 1 shows no connections among the MCWGs that form the arrays 102 (e.g., read word lines RWLs 131, write bit lines WBLs, read bit lines RBLs), although it is to be understood that such connections are indeed present but have been omitted merely for clarity purposes.

It should be noted that word decoders and drivers 120 drive a read word line 131 a local write select line 132 (or write word line) as known in the art.

FIG. 1 shows write column/bit control flows 105 emerging from passive transmission line (PTL) circuits, read bit line flux generation circuits, senses amplifiers, bit line write driver circuits, etc., represented collectively as blocks 106. Each of the PTL circuits, read bit line flux generation circuits, senses amplifiers, bit line write driver circuits, etc. blocks 106 generates control signals supplied to each MCWG 104 in a corresponding array 102.

Key elements of the pseudo floorplan for the illustrative memory system 100 include at least one memory array 102, at least one write data bus 114, of which a single "bit" is shown, at least one read data bus 116, of which a single "bit" is shown, at least one passive transmission line (PTL) circuits, read bit line flux generation circuits, senses amplifiers, bit line write driver circuits, etc. block 106, at least one word decoders and drivers block 120, a collection of enables, addresses, and timing 130, and a superconducting memory array and bus resource arbitration element (SMABRAE) 150; the SMABRAE may symbolically represent a plurality of SMABRAEs that are physically distributed throughout the memory system 100. The pseudo floorplan of the overall superconducting memory system 100 can, in one or more embodiments, further include at least one bit control circuits block 122.

The following topological interconnections among the components in the superconducting memory system 100 are shown only sparsely: [1] with respect to read bus and write bus elements 108 (For the read bus element, signals are received by PTL receivers and driven onto a next stage by PTL drivers. Internally, a read datum from a local array 102 is buffered and received within block 106 by Josephson transmission lines (JTLs) and an OR gate) that connect to a read and write bit slice 110 within the PTL circuits, read bit line flux generation circuits, senses amplifiers, bit line write driver circuits, etc. blocks 106, in one or more embodiments; [2] with respect to the word decoders and drivers 120 that connect to corresponding arrays 102, identifying a subset of memory cells within the array involved with a particular read or write operation; and [3] with respect to the bit control circuits 122 that drive the circuits of block 106 (which can also be integrated within the space allocated to the PTL circuits, read bit line flux generation circuits, senses amplifiers, bit line write driver circuits, etc. 106). A read and write bit slice 110 includes the bit of the read data bus 116, the bit of the write data bus 114, columns of memory cells in each array 102 (not explicitly shown, but implied), and the necessary support circuitry associated with the columns of memory cells. Along with the memory cell write groups and other options to improve the densities of arrays disclosed herein and in U.S. patent application Ser. No. 17/976,179 by W. Reohr, this overall organization of JMRAM (or other memories) according to embodiments of the invention can potentially lead to the realization of the highest density memory with the fewest layers of metal interconnect having the highest read-write throughput, as will be discussed herein. However, the organization of FIG. 1 does not limit the scope of the embodiments of the present invention because, as will be explained, the bit of the read data bus 116 and the bit of the write data bus 114 can be shared with multiple bit slices, in accordance with one or more embodiments of the invention-a significant step to reducing metal interconnect layers.

A read bus element can serve at least the following two purposes. [1] During a period of time (e.g. a RQL phase delay), the read bus element (part of 108) can receive data from a preceding read bus element and its associated memory arrays (if they exist), and can send the data onto a subsequent (i.e., next) read bus element (or set of arrays) in a bit of a read data bus 116 passing over the top of the arrays, or send the data out to converge with a system read bus. Data is transmitted at a rate/frequency of one bit per cycle (actually, whatever rate RQL or other superconducting technology allows). Except for the first and last read bus elements in the series, the read bus element 108 is disposed between input and output conductors (e.g., shielded transmission lines) that traverse over the top of array(s) 102 and passive transmission line (PTL) circuits, read bit line flux generation circuits, sense amplifiers, bit line write driver circuits, etc. block(s) 106. [2] During a period of time (e.g. a RQL phase delay), different from delays associated with [1], the read bus element can integrate data generated by its associated array(s) into a bit of the read bus data path, sending data onto a next read bus element 108 in the bit of the data bus (or onto the system bus), at a rate/frequency of one bit per cycle (actually, whatever rate RQL or other superconducting technology allows). The read bus elements function collectively to retrieve data from the arrays with which they are associated.

In one or more embodiments, a write bus element (part of 108) can beneficially serve at least the following two purposes. [1] The write bus element 108 can receive data from a preceding element and its associated arrays (if they exist) and can send the data onto a subsequent (i.e., next) write bus element (or set of arrays) in a bit of a write data bus 114 passing over the top of the arrays. Data is transmitted at a rate/frequency of one bit per cycle (actually, whatever rate RQL or other superconducting technology allows). Except for the first and last write bus elements in the series, the write bus element 108 is disposed between input and output conductors (e.g., shielded transmission lines) that traverse over the top of array(s) 102 and passive transmission line (PTL) circuits, read bit line flux generation circuits, sense amplifiers, bit line write driver circuits, etc. block(s) 106. [2] The write bus element 108 can deliver data, intended for a write operation, to write circuits that feed its associated array(s) at an average rate of one bit per cycle (actually, whatever rate RQL or other superconducting technology allows).

It should be understood that a subset of circuits from the PTL circuits, read bit line flux generation circuits, sense amplifiers, bit line write driver circuits, etc. blocks 106 can be positioned vertically, above or below, its associated array 102 to improve integration with (i.e., connection to) its corresponding memory array. Other circuits such as bit control circuits 122, which can, for example, indicate when to sample data from a shared data bus, can advantageously be integrated along with the blocks 106.

The thick arrows 105 shown in FIG. 1 are intended to indicate that the bit write select control flow 105 can also be propagated initially from the write control flow initiator circuits located within the PTL circuits, read bit line flux generation circuits, senses amplifiers, bit line write driver circuits, etc. blocks 106 to each write select circuit within each MCWG 104 within a column of write select circuits. Such control signals can, for example, turn off the write-select current (i.e., hard-axis current/field) from flowing through a superconducting loop that includes the write select circuit and local write select line (and possibly superconducting ground) of a write-selected MCWG 104, and drive the write select circuit into a state where it recovers flux quanta to enable its next write operation. The bit write select control flow 105 can be configured proximate to the write select circuits within a column. Both can share a common resonant clock.

As is known by those skilled in the art, the word decoders and drivers 120 can support selections of rows of memory cells, or memory cell write groups in accordance with embodiments of the invention, for write operations and can independently support selection of rows of memory cells for read operations.

It is to be appreciated that within this detailed description of preferred embodiments, a broad discussion of read and write circuits follows that not only applies to JMRAM but also to other memory architectures, such as, for example, passive random access memory (PRAM). Such topics range from those associated with the core bit-write circuits, through control logic, through data path pipelines, to circuits for time-division multiplexing for read operations and demultiplexing circuits for write operations, including the following: [1] A superconducting distributed bidirectional current driver is disclosed which can source bi-directional write currents to write bit lines (WBLs) that generate easy axis fields (or phase-based-torque) for writing data into write-selected JMRAM memory cells (write-selected cells are selected by the write word line WWL or the local write select line LWSL, as disclosed in Reohr). [2] Managed by various write control signals overseen by the SMABRAE 150, a time-domain demultiplexing system for writing data to memory cells within an array is disclosed that can receive write data signals (and write control signals) from a write data bus and latch those write data signals, on particular cycles specified by a demultiplexer-write control signal (subsequently referred to herein as "turn-on" 134 and "write enable" 134) as circulating currents in a subset of bit write superconducting loops (associated with the array of memory cells). In addition, write address and control signals also need to be delivered to the write circuits of the word decoders and drivers 120. Each write bit superconducting loop includes a write bit line WBL conductor, a bit line write driver circuit, and preferably a superconducting ground conductor. The superconducting memory system 100 can include the aforementioned superconducting distributed-bidirectional current driver or a conventional bidirectional current driver. [3] Managed by read control signals overseen by the SMABRAE 150, a time-domain multiplexing system for reading data from memory cells within an array is disclosed that can receive write address and control signals (into word decoders and drivers) that specify a particular array, and row of memory cells, to be accessed each cycle, and retrieve the data associated with those memory cells. The time-domain multiplexing for a read access delivers data across multiple cycles. [4] Critical features of a superconducting memory array and bus resource arbitration element (SMABRAE 150), which organizes and supplies data read and write requests from and to, respectively, the high capacity superconducting memory (other memories are also contemplated which might not pass through the SMABRAE), are disclosed (for JMRAM and other superconducting memories) as a stream-centered micro-architecture/architecture for hybrid-quantum-classical-superconducting-computing systems (because the read and write latencies to and from memory are anticipated to be long relative to the pipeline delays in any classical execution units, and extraordinarily long relative to any quantum execution units).

The time-domain demultiplexing system for a write operation (i) can be used to initiate a write of a memory element immediately, or (ii) can temporarily capture/store a subset of the data, intended for a write operation to a set of write-selected memory cells, in superconducting loops that include a subset of WBLs associated with the subset of write-selected memory cells (e.g., easy-axis field with respect to an MJJ). The disclosed superconducting latching functioning of embodiment (ii) beneficially reduces circuit overhead in the write data path at least in part because no data latches are required to achieve time-domain demultiplexing (i.e., across multiple cycles) of data from a bit of a write data bus into a plurality of WBLs. In addition, as will be discussed in further detail below, no longer does a bit of a write data bus 114 need to be associated exclusively with each read and write bit slice 110 as defined for FIG. 1; rather, the data bus can be shared by a plurality of bit slices.

The exemplary JMRAM memory system 100 depicted in FIG. 1 functions as an illustrative superconducting memory for the embodiments of the present invention. It should not, however, be considered limiting of the embodiments of the present invention, which apply more broadly to superconducting analog circuits, to superconducting memory, to superconducting logic pipelines, and to interactions of superconducting memory with superconducting control and data flow logic. In addition, one or more embodiments of the present invention can interact with quantum computing pipelines—storing data from them or retrieving data for their use. All the aforementioned entities can interact to retain or retrieve data, in flight or at rest, within a logic circuit, a memory cell, a logic latch or quantum bit (i.e., qubit), or collection of quantum bits.

Of particular importance to superconducting systems or circuits, locations of "slave" entities (e.g., memories) on a chip or in a multi-chip system define certain delays with respect to "master" entities and other "slave" entities that involves manipulating the cycle delays of individual bits transferred between/among them (in passing information onto them or in retrieving data from them). For example, these delays can be adjusted on a cycle-by-cycle and bit-by-bit basis, preferably on behalf of the "master" entity (e.g., a quantum execution pipeline) according to where the entities are located on the chip (and also how they are mirrored physically), in the multi-chip system, or along the bus latencies among entities, and etc. The management of bit latencies is just one of the many management oversights of the control logic according to embodiments of the invention that will be described herein.

With continued reference to FIG. 1, it is important to reiterate the following convention design approach before discussing time-division multiplexing: A representative read and write bit slice is indicated by the dashed circle 110 that encloses a representative bit of the read data bus 116 and a representative bit of the write data bus 114. The bit slice 110 is preferably representative and includes all circuits associated with this bus, spanning the set of vertically stacked arrays 102. Examples may include (i) memory cells that connect to a common read bit line RBL and a common write bit line WBL within each of the memory arrays 102, (ii) bit line write driver circuits (also referred to herein as superconducting bidirectional write drivers), and transmission lines, (iii) PTL drivers and receivers 133, read bit line flux generation circuits, and (iv) sense amplifiers. In FIG. 1, all these circuits were associated with a bit of the read and write data bus. The superconducting memory system 100 further includes a turn-off or turn-on/write enable connection 134 which passes over the memory arrays 102.

For a read operation, a distributed-read multiplexer circuit can be realized again with careful attention paid to the timing of each array activation in the set of arrays associated with (i.e., corresponding to) the distributed-read multiplexer circuit. Read and write buses can have different levels of array 102 hierarchies. Thus, read requests can differ in the actual set of arrays that each operation interrogates/consumes/off-lines and in the frequency and latency of the operations. Implementation details are unique to the requirements of the design, whether they involve a RAM type (e.g., JMRAM or PRAM) that will be exploited or a desired memory micro-architecture/architecture that will be implemented.

In the superconducting memory system 100, a read and write bit slice 110 indicates that for every one bit of bit of the write data bus 114, there is one bit of the read data bus 116.

It is important to note that the cycle time of an RQL bus (or RQL logic) can range, for example, from about 100 ps to about 250 ps, or about 10 gigahertz (GHz) to about 4 GHz, while the write cycle time of JMRAM memory cells likely will exceed 5 ns (e.g., about 10 ns). In practical terms, the write cycle time of JMRAM is significantly long for level 2 memories. When generalized, however, it will be seen that novel time-division multiplexing read and write circuits and schemes according to embodiments of the invention, used in conjunction with the intrinsic latching capability of JMRAM, can sustain the high data rates consumed and generated by execution units of hybrid quantum and classical systems that process data streams. Moreover, these time-division multiplexing circuits advantageously reduce circuit overhead (e.g., registers, latches, level 1 caches, etc.) and system wiring congestion, among other benefits.

Figure 2A:
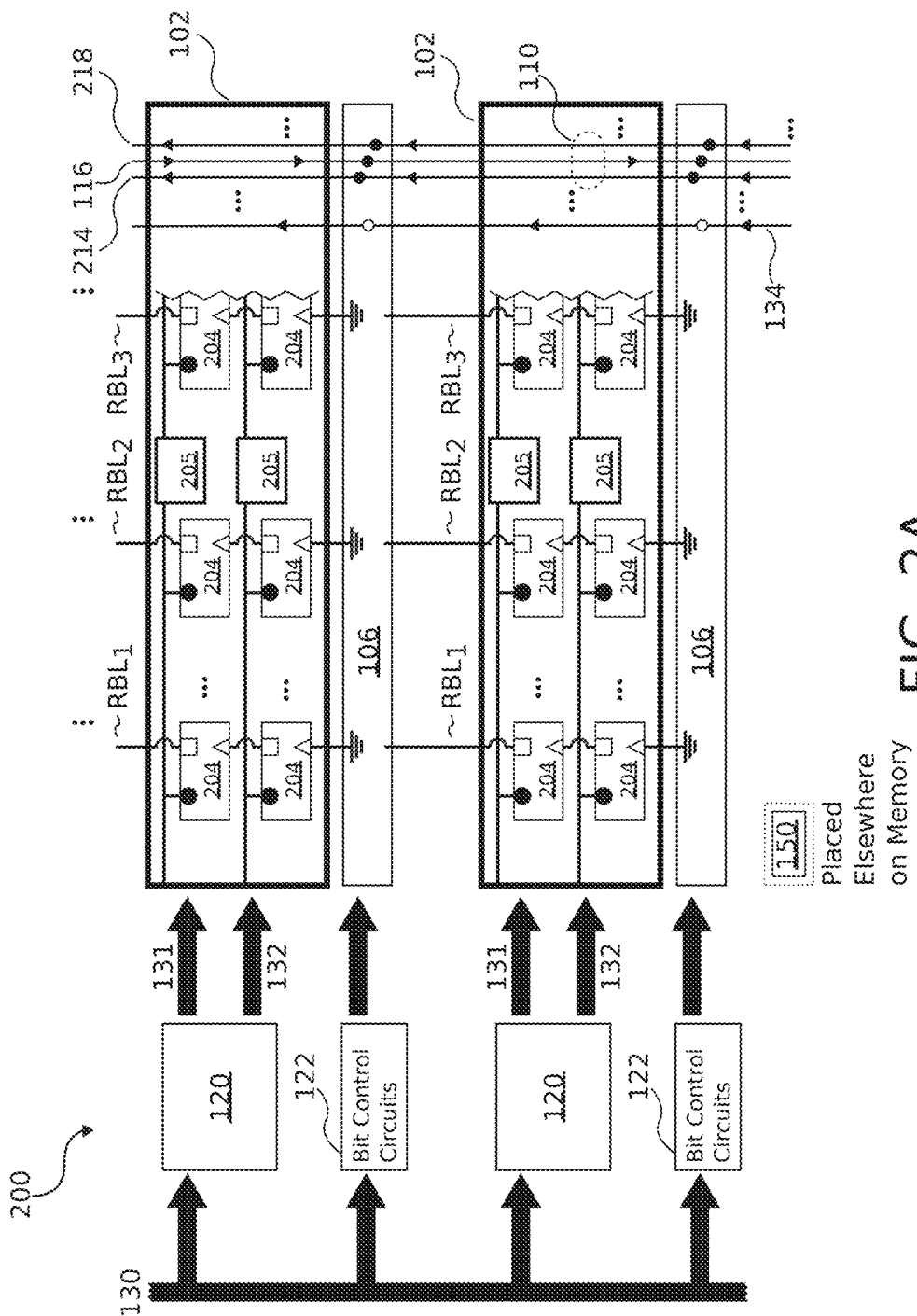
FIG. 2A is a schematic diagram depicting at least a portion of a second exemplary superconducting memory system, according to one or more embodiments of the present invention.

FIG. 2A is a schematic diagram depicting at least a portion of a second exemplary superconducting memory system 200, according to one or more embodiments of the invention. The superconducting memory system 200 includes a plurality of memory arrays 202 that can contain memory cells (MC) 204 and repeaters 205 for the read word line system. The array 202 is shown to implement a radio frequency (RF)-transmission-line-based read path system, which is employed in most versions of JMRAM and also PRAM. It is clearly described by the following two publications: Tahara, S., et. al., "A 4-Kbit Josephson nondestructive read-out RAM operated at 580 psec and 6.7 mW," IEEE Transactions on Magnetics (1991); and Randy P., et. al., "Demonstration of Superconducting Memory with Passive-Transmission-Line-Based Reads," Proceedings of the Fifth International Symposium on Memory Systems (2019), the disclosures of which are incorporated by reference herein in their entirety for all purposes.

For greater generality, FIG. 2A shows only the read path connections—read word lines (e.g., RWL1 131 and RWL2 131) and read bit lines (e.g. RBL1, RBL2, and RBL3), connected according to the symbolic convention for the read circuits of a memory cell established with respect to FIG. 2A of U.S. patent application Ser. No. 17/976,179 by W. Reohr, the disclosure of which is incorporated by reference herein in its entirety. Specifically, using this convention for the memory cells 204, a circle represents an input and output connection of a read word line to a transformer element, a square represents a read bit line (RBL) input connection, and a triangle represents a read bit line output connection; write path connections (e.g., write word lines (WWL) and write bit lines (WBL)) are omitted because they are different for JMRAM and PRAM architectures. While JMRAM requires only superconductor traces/conductors to deliver write data to the selected memory cells from the array periphery, PRAM requires the inclusion of JTLs for propagation of write-select signals to selected memory cells for a write operation and, moreover, requires JTLs to propagate the data signals along the write bit lines and eventually write the state of the selected memory cells.

For the superconducting memory system 200, compared to the illustrative superconducting memory system 100 shown in FIG. 1, the write data bus connection has been expanded to include separate connections for even bits of write data bus 214 and odd bits of write data bus 218. The read data bus in the superconducting memory system 200 remains the same as the superconducting memory system 100 shown in FIG. 1, providing a single bit of read data bus. As in the superconducting memory system 100 of FIG. 1, the superconducting memory system 200 includes a turn-off or turn-on/write enable connection which passes over the memory arrays 202.

The superconducting memory system 200, like the exemplary superconducting memory system 100 depicted in FIG. 1, can be integrated with other memory, "classical" executions units (i.e., Boolean logic based), "classical" control units, quantum entities, etc., to form a superconducting computation system. It is important to understand that the superconducting memory system 200 disclosed herein includes embodiments that apply to other low-temperature memories and analog circuits. While JMRAM will be discussed in greater detail than PRAM with respect to the remainder of the figures, the embodiments disclosed should not be considered limiting to MRAM, PRAM, or any other specific memories. Incidentally, JMRAM uses MJJs as its core memory element, and PRAM uses a D-type flip-flop formed with JJs.

To generalize the discussion herein, it should be appreciated that memory elements in a superconducting system can include even temporary/transient ones, enabled by logic-JTL combinations, qubits, or JTLs alone that collectively occupy RQL cycles. Unlike RQL pipelines, CMOS system pipelines require registers/latches to assure signal spacing between cycles and signal alignment at every logic gate. Thus, it is important to keep in mind that signals in motion are remembered in RQL, as they are passed from one set of logic gates, JTLs, and PTLs to the next set associated with the next 90 degree phase, all the while potentially being transformed, in a RQL pipeline where computation is being performed. Recognizing an RQL pipeline as transiently shifting memory itself could enable more efficient computer micro-architectures/architectures to be formed. These architectures would require less circuitry and would be beneficial for processing, in particular, certain types of data, for example, stream data. These topics will be addressed herein below in a discussion of a stream-centered micro-architecture/architecture for hybrid-quantum-classical-superconducting-computing systems and in appendix "B" titled "Collaborative Execution Pipelines That Take Advantage Of Read Data Skews Arising in the Access of Memories and in the Delivery of Data to the Execution Pipelines via Buses."

The JMRAM memory systems according to one or more embodiments of the invention shown and described herein (e.g., 100 of FIG. 1 and 200 of FIG. 2A) are merely illustrative and should not be considered limiting. Rather, it should be understood that embodiments of the present invention apply more broadly to superconducting memory, to superconducting logic pipelines, and to interactions of superconducting memory with superconducting control and data flow logic. In addition, one or more embodiments of the invention can interact with quantum computing pipelines— storing data from them or retrieving data for their use. The aforementioned entities can interact to retain or retrieve data, in flight or at rest, within a logic circuit, a memory cell, a logic latch or qubit (or collection of qubits).

Of particular importance to superconducting systems or circuits, locations of "slave" entities on a chip (e.g., or within a memory array) define certain delays with respect to "master" entities and other "slave" entities that involves manipulating the cycle delays of individual bits transferred between/among them (in passing information onto them or in retrieving data from them). For example, these delays can be adjusted on a cycle-by-cycle and bit-by-bit basis, preferably by a "master" entity, according to where the entities are located on the chip (and also how they are mirrored physically), bus latencies among entities, etc. The management of bit latencies is just one of the many management oversights of the control logic of the embodiments that will be described with respect to the discussion of FIG. 2A. Other management oversights may include, for example, arbitrations of the use of entities.

Figure 2B:
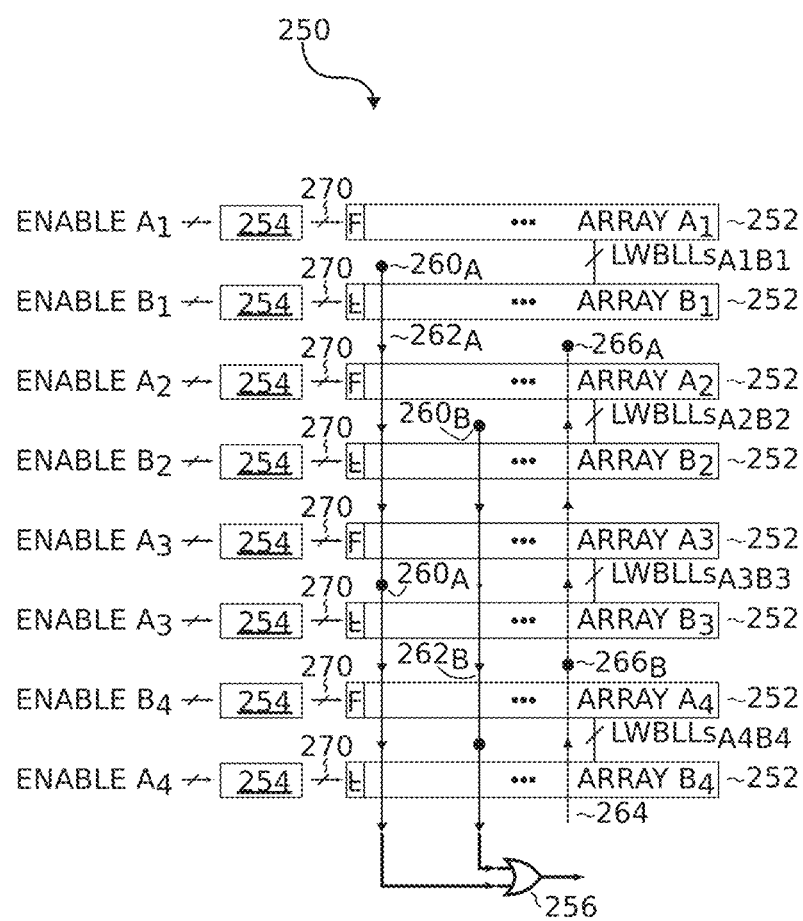
FIG. 2B is a schematic diagram depicting at least a portion of a third exemplary superconducting memory system that emphasizes unique read and write bus connections to the memory arrays, according to one or more embodiments of the present invention.

FIG. 2B is a schematic diagram depicting at least a portion of a third exemplary superconducting memory system that emphasizes unique read and write bus connections to the memory arrays, according to one or more embodiments of the invention. Specifically, FIG. 2B depicts a high-capacity memory system 250 demonstrating a low-latency bit of a read bus and a circuit-efficient bit of a write bus, according to one or more embodiments. Local connections from read circuits and to write circuits can involve logic that assists in time-division multiplexing of data, as will be described in further detail herein below. The high-capacity memory 250, demonstrating a low-latency read bus, includes a plurality of memory arrays 252, decoders ("dec") 254, read word lines 270, interleaved bits of a read data bus 262A, 262B comprised of conductors (e.g., shielded transmission lines) and read bus elements 260A and 260B, wherein the bits of the read data bus are being sourced with data by read bus elements 260A and 260B that receive data from the arrays 252.

As apparent from FIG. 2B, the read bus elements 260A, 260B of the corresponding interleaved bits of the read data bus 262A, 262B can each receive data from the two most proximate arrays 252 to them that face one another, the first array having a physical (layout) orientation of "F" and the second array having a physical orientation of "F" mirrored about the x-axis (horizontal axis), as indicated on the arrays 252. It is important to note that each bit of the read data bus (e.g., 262A or 262B) skips over (i.e., does not connect to) mirrored pairs of arrays associated with, connecting to, the other read data bus (e.g., 262B or 262A, respectively). While separated visually to more clearly explain the circuit topology of the two interleaved bits of the read data bus 262A, 262B, both bits receive data from memory cells that would be part of a common bit slice passing through all the arrays 252 and thus would be proximate to one another, though, as already explained, each bit of a bus receives data from a different (mutually exclusive) subset of the arrays 252.

Merging the data from the common bit slice stretching across all the arrays 252, an OR gate 256 can be added to halve the data width of the read bus extension returning to the SMABRAE 150 (or execution or instruction units). By arranging the bits of the read data bus in this manner, the insertion delay of read bus elements is reduced by at least a factor of two; if more bits are associated with one bit slice, a factor greater than two can be realized. The insertion delay of each read bus element usually includes the delay inherent in a PTL receiver, PTL driver, OR gate, and its associated JTLs, as will be discussed with respect to a novel time-division multiplexing scheme for the read operation.

In addition to the memory arrays 252, decoders 254 and interleaved bits of the read data bus 262A, 262B, the illustrative high-capacity memory 250, in one or more embodiments, includes at least one bit of a write bus 264, which includes conductors (e.g., shielded transmission lines) and write bus elements 266A and 266B, and local write bit line links (LWBLLs) that, whether composed of JTLs (for PRAM) or conductors (for JMRAM), form a continuous write bit line between proximate arrays, which they are shown to connect. For a PRAM application, the memory arrays 252 shown in FIG. 2B can have the same or different write bit line directions with respect to their read bit line directions to assure the prevailing data flow from the write bit element 266A, 266B outward (either up or down) through the arrays. The local write bit line links are labeled to indicate their connection between the arrays; for example, LWBLLsA1B1. refers to the local write bit line links corresponding to arrays A1 and B1. This arrangement of circuits can beneficially reduce the overall area of the circuits dedicated to writing the memory cells.

Unlike the previously described memory arrays (e.g., 102 of FIG. 1 and 202 of FIG. 2A), the memory arrays 252 shown in FIG. 2B are representative of arrays having unspecified internal structures, such as, for example, RQL read and RQL write data paths having NDRO memory/storage cells. RQL data path arrays are described in the known literature, including Burnett R. et. al., "Demonstration of Superconducting Memory for an RQL CPU," Proceedings of the Fourth International Symposium on Memory Systems (2018), and Dorojevets M. and Chen Z., "Fast Pipelined Storage for High-Performance Energy-Efficient Computing with Superconductor Technology," 12 International Conference & Expo on Emerging Technologies for a Smarter World (2015), the disclosures of which are incorporated by reference herein in their entirety for all purposes.

Although embodiments of the invention are not limited to any specific logic configurations, the logic used in the superconducting memory is presumed to be RQL. Also, it is important to note that signal alignment is depicted throughout this disclosure even though, based on physical and fan-out requirements, logic may need to be placed on different phases of an RQL cycle (of which there are typically four phases, although not limited to four phases), as will become apparent to those skilled in the art. In other words, insertion of JTLs and partitioning of them into four phases due to fan-out, physical, and logic-circuit requirements is well understood in the art. For example, for the NDRO memory cell reported by Burnett, the phase of JTLs must be incremented by 90 degrees (i.e., one phase) every two cells (two bit lines). JTL phases are therefore not depicted in any of the schematics shown in the figures or described in the present disclosure. Instead, only cycle delays (i.e., four phase delays) are indicated later in this detailed description for the purpose of explaining how wave pipelining can be used to implement efficient time-division multiplexing for reading and writing the memory.

Unlike conventional memories, time-division multiplexing circuits for read and write operations are proposed that are associated with every array (i.e., "slice" in the following paper) associated with a bus (i.e., global bit line), as will be discussed herein below. These buses reduce wiring congestion over the memory arrays (e.g., 102 in FIG. 1, 202 in FIG. 2A, and 252 in FIG. 2B). Moreover, the bus is advantageous because data from a read operation of denser memory can be ported to faster memory across narrower buses that reduce intra-chip and inter-chip wire congestion. With additional OR gates inserted in the data flow path returning from the memory arrays 252 to the SMABRAE (150 in FIGS. 1 and 2A), data from other sets of arrays can be merged into a global read return bus. Individual array enablement (e.g., via "enable A1" of FIG. 2B), coordinated by the SMABRE (150 of FIG. 2A), assures collision-free propagation of data through the bus.

Wrapping up the discussion of a superconducting memory, it is important to state that term "superconducting memory" (or "memory") can refer to at least the following, as known in the art: (1) a random access memory (RAM); (2) a read only memory (ROM); (4) a content addressable memory (CAM); (5) a programmable logic array (PLA); and (6) a field programmable gate array (FPGA). For PLAs and FPGAs, the underlying "state" memory defines logic function. For the time division multiplexing schemes described next, their use principally relates to RAMs, ROMs, CAMs, and PLAs, which are regular array structures crowded/populated with memory cells.

An Illustrative Superconducting Distributed Bidirectional Current Driver

FIGS. 3-8 are illustrative schematic diagrams which, collectively, conceptually describe the topology and operation of a superconducting distributed bidirectional current driver system/circuit in accordance with embodiments of the invention. The superconducting distributed bidirectional current driver system, for memories, can serve as a bit line write driver circuit, and can realize a portion of a write data bus that extends from the superconducting memory array and bus resource arbitration element (e.g., SMABRAE 150 in FIGS. 1 and 2A) into and/or through PTL circuits, read bit line flux generation circuits, sense amplifiers, bit line write driver circuits, etc. block (106 of FIG. 1 and 202 of FIG. 2) located proximate to each of the memory arrays (e.g., 102 in FIG. 1 and 202 in FIG. 2A). The superconducting distributed bidirectional current driver system according to embodiments of the invention is configured to provide a bidirectional current through a load (e.g., at least one write bit line WBL for memories) which has entrance and egress connections that are distant (i.e., not proximate) from one another.

In practice, a conventional bidirectional current driving system (e.g., as described in U.S. Pat. No. 10,122,351 by Naaman et. al., the disclosure of which is incorporated herein by reference in its entirety for all purposes) undesirably constrains the physical design of the load conductor, particularly for the write bit lines of arrays (102 of FIG. 1 and 202 of FIG. 2). Due to topological considerations, the load conductor—a write bit line in many applications—should preferentially exit, and return to, the superconducting bidirectional current driver at proximate locations. Thus, a need arises for a superconducting distributed bidirectional current driver system according to aspects of the invention, as disclosed herein.

Figure 3:
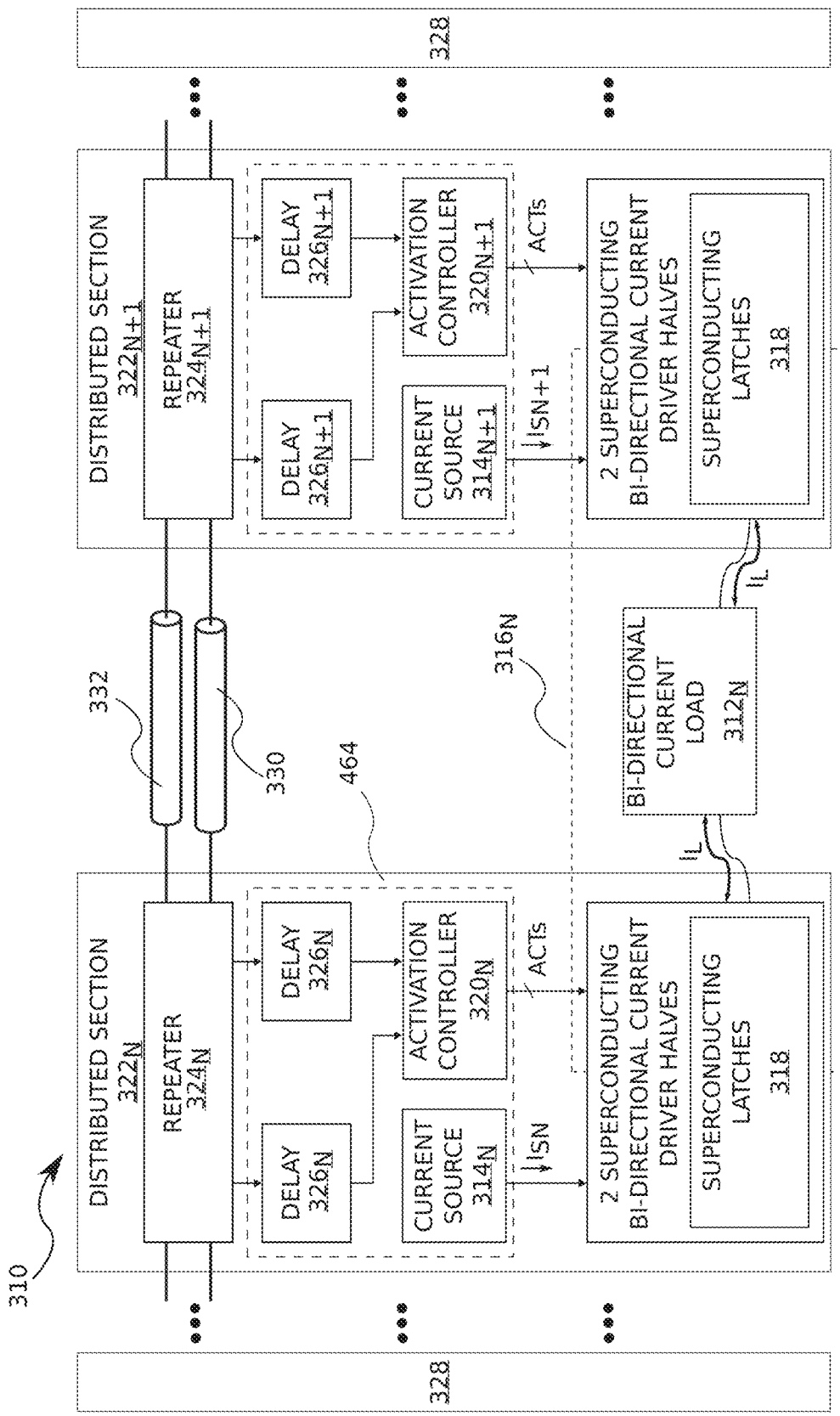
FIG. 3 is a schematic diagram depicting at least a portion of an exemplary superconducting distributed-bidirectional current driver system, according to one or more embodiments of the present invention.

By way of example only and without limitation, FIG. 3 is a block diagram depicting at least a portion of an illustrative superconducting distributed bidirectional current driver system 310, according to one or more embodiments of the invention. The bidirectional current driver system 310 includes a plurality of distributed sections; two adjacent distributed sections, 322N and 322N+1, are shown, where N is an integer. The superconducting distributed bidirectional current driver system 310 is well-suited for any of a variety of applications (e.g., quantum or classical computer systems), and is configured to provide bidirectional current flow through a bidirectional current load 312N, as will be explained in further detail below. The bidirectional current load 312N can be configured as an inductive load, such that the load can be inductively coupled to or can function as a write-current line in a memory system to write a first logic state or a second logic state in a selected memory cell(s). The distributed sections 322N, 322N+1 can be linked together by the bidirectional current load 312N, as well as one or more conductors or passive transmission lines, including, for instance, a current-direction conductor 330 and a turn-on conductor 332. For JMRAM, the state of the signal on the current-direction conductor represents datum driven to the memory cell through a positive or negative current flowing in the write bit line.

With reference to FIG. 3, the superconducting distributed bidirectional current driver system 310 further includes at least two current sources, 314N and 314N+1, included in adjacent distributed sections, 322N and 322N+1, respectively. The current sources 314N, 314N+1 are configured to generate at least two input currents, IS_N and IS_N+1, respectively. As an example, the current sources 314N, 314N+1 can be configured as a flux shuttle or flux pump for generating the input currents IS_N and IS_N+1 based on a sequential triggering of a sequence of Josephson junctions about a loop, with each triggering of a Josephson junction generating a current increment that is stored in a storage inductor, or other storage element. The superconducting distributed bidirectional current driver system 310 also includes a superconducting bidirectional current driver 316N, comprising superconducting latches 318 from two adjacent distributed sections 322N and 322N+1, that receives the input currents IS_N and IS_N+1 and is configured to selectively steer the input currents IS_N and IS_N+1 through the bidirectional current load 312N as a load current, IL, in a first direction or a second direction.

In the illustrative embodiment shown in FIG. 3, the superconducting distributed bidirectional current driver 316N includes a plurality of superconducting latches 318 that are selectively activated to control the direction of the load current IL through the at least one bidirectional current load 312N. The elements of the superconducting distributed bidirectional current driver(s) 316N, in this embodiment, are supported by two sections 322N,322N+1, which are connected to the bidirectional current load 312N, wherein, in a memory application, each distributed section (322N or 322N+1) supports one or two write bit lines.

The superconducting latches 318 in each distributed section 322N, 322N+1 are preferably activated via respective activation signals, ACTs, that are provided from corresponding activation controllers, 320N and 320N+1 (which is controlled, in part, by a "current-direction signal" propagated preferentially by a passive transmission line (PTL) network), such that the activation controllers 320N, 320N+1 can provide the appropriate activation signals ACTs to activate the respective superconducting latches 318 that correspond to the desired direction of the load current IL through the bidirectional current load (e.g., 312N). As an example, the activation signals ACTS can be provided as single flux quantum (SFQ) pulses or reciprocal quantum logic (RQL) pulses, in one or more embodiments.

In one or more embodiments, each of the distributed sections 322N, 322N+1 in the superconducting distributed bidirectional current driver system 310 includes preferably one repeater 324 for receiving and driving current direction signals and/or other control signals through passive transmission lines (e.g., conductors 330, 332) that transfer such signals between distributed sections 322N, 322N+1 and for driving signals to delay elements (e.g., 326N) or the activation controller 320N, 320N+1 within a corresponding distributed section 322N, 322N+1. According to one or more embodiments, each of the distributed sections 322N and 322N+1 includes delay elements 326N and 326N+1, respectively, of varying delay (e.g., from zero phases to the number of phases it takes to cross the arrays (102 of FIG. 1 and 202 of FIG. 2)), coupled in a signal path between the repeater 324 and activation controller 320N, 320N+1. The delay elements 326N, 326N+1 are configured to generate a prescribed delay according to where the distributed section appears in the chain of write bit elements (e.g. within the repeater 324). The delay elements 326N, 326N+1, which may be synchronized to a resonant clock propagated throughout the system, are configured to assure simultaneous (or near simultaneous) activation of all bidirectional current drivers 316N, 316N+1 in a strand enclosed by a terminator section 328. The current source 314N, 314N+1, activation controller 320N, 320N+1, repeater 324, and delay elements 326N, 326N+1, in a given distributed section 322N, 322N+1 will be collectively referred to as a current source, activation controller and repeater element (CSACRE) block 464 in subsequent descriptions in connection with FIG. 4.

With continued reference to FIG. 3, the superconducting distributed bidirectional current driver system 310 includes two terminator sections 328. Embodiments of the invention contemplate multiple ways to form the terminator section 328. For example, one way to implement the terminator section 328, according to one or more embodiments, is to alter a distributed section 322N, 322N+1 so that (i) it only connects to a bidirectional current load (e.g., 312N) on one of its sides, for example at the midpoint of a first stack of two superconducting latches 318, and (ii) its internally-generated activation signals, ACTS, direct input current IS_N, IS_N+1 appropriately, depending on data state, through the bidirectional current load 312N on one of its sides or through, for example, a second stack of two superconducting latches 318. These connections will be described in further detail herein below. Thus, the terminator section 328, in one or more embodiments, can be made almost identical to a distributed section 322N, 322N+1, except that signals are not propagated through the terminator section and ACT signals to latch elements 318 are altered.

Figure 4:
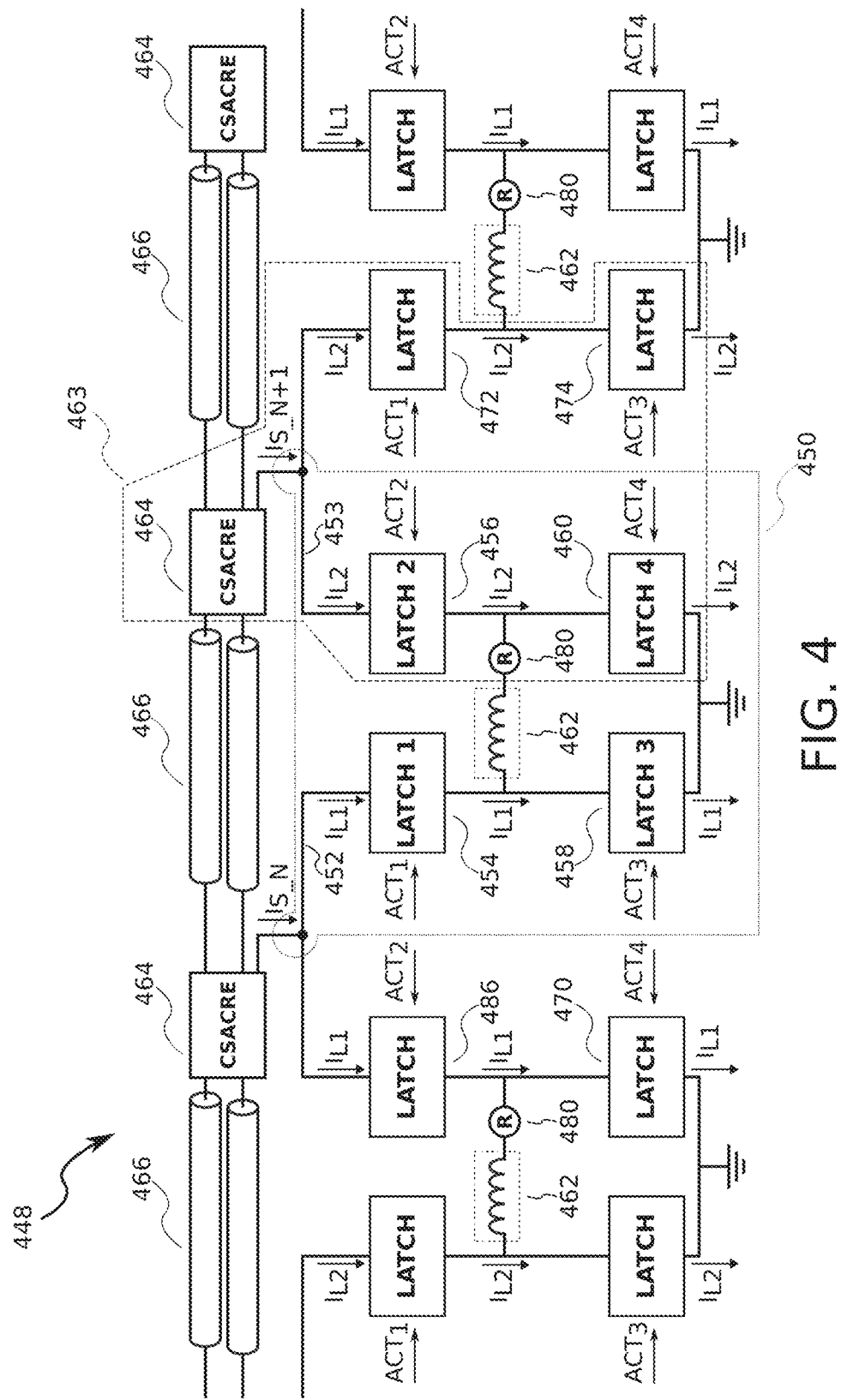
FIG. 4 is a schematic diagram depicting at least a portion of an illustrative superconducting distributed bidirectional current driver system that uses superconducting latches to distribute bidirectional currents through a multiplicity of conductors (e.g., write bit lines), according to one or more embodiments of the present invention.

FIG. 4 is a block diagram conceptually depicting at least a portion of an exemplary superconducting distributed bidirectional current driver system 448, according to one or more embodiments of the invention. Although further details of the superconducting bidirectional current driver system 448 are shown, there may be additional functional elements found in conventional superconducting bidirectional current drivers (e.g., as disclosed by O. Naaman et. al.) that have been omitted merely for clarity and to provide a less encumbered description of the preferred embodiments. Missing, for example, are the terminator sections (328 in FIG. 3), bidirectional current loads (312N in FIG. 3), and controllers to the left (beginning) and right (ending) of the drawn schematic. It should be understood, however, that these conventional elements remain part of an operable superconducting bidirectional current driver in accordance with embodiments of the invention.

A core of the superconducting distributed bidirectional current driver 450 (referred to herein as a bidirectional current driver core) preferably corresponds to the superconducting bidirectional current driver 316N in the illustrative embodiment of FIG. 3. Therefore, reference will be made to the exemplary superconducting distributed bidirectional current driver system 310 of FIG. 3 in the following description of the illustrative superconducting bidirectional current driver system 448 shown in FIG. 4.

With reference to FIG. 4, the bidirectional current driver core 450 is implemented using an H-bridge circuit topology that is connected to nodes 452 and 453 and a low-voltage return rail, which may be ground. An H-bridge is an electronic commutation circuit that switches the polarity of a voltage or current applied to a load. The bidirectional current driver core 450, in one or more embodiments, is formed using switching elements (e.g., superconducting latches) from respective portions of adjacent distributed sections associated with current sources generating input currents $I_{S\_N}$ and $I_{S\_N+1}$. The input currents $I_{S\_N}$ and $I_{S\_N+1}$ are provided to nodes 452 and 453, respectively, such as from the plurality of current sources ($314_N$, $314_{N+1}$ shown in FIG. 3) as inputs to the H-bridge circuit in the bidirectional current driver core 450. When used in DC motor control applications, an H-bridge circuit generally employs four transistors configured as switching elements to selectively control the direction of current flow. In the bidirectional current driver core 450 according to embodiments of the invention, superconducting latches are used in place of the transistor switching elements.

Figure 5:
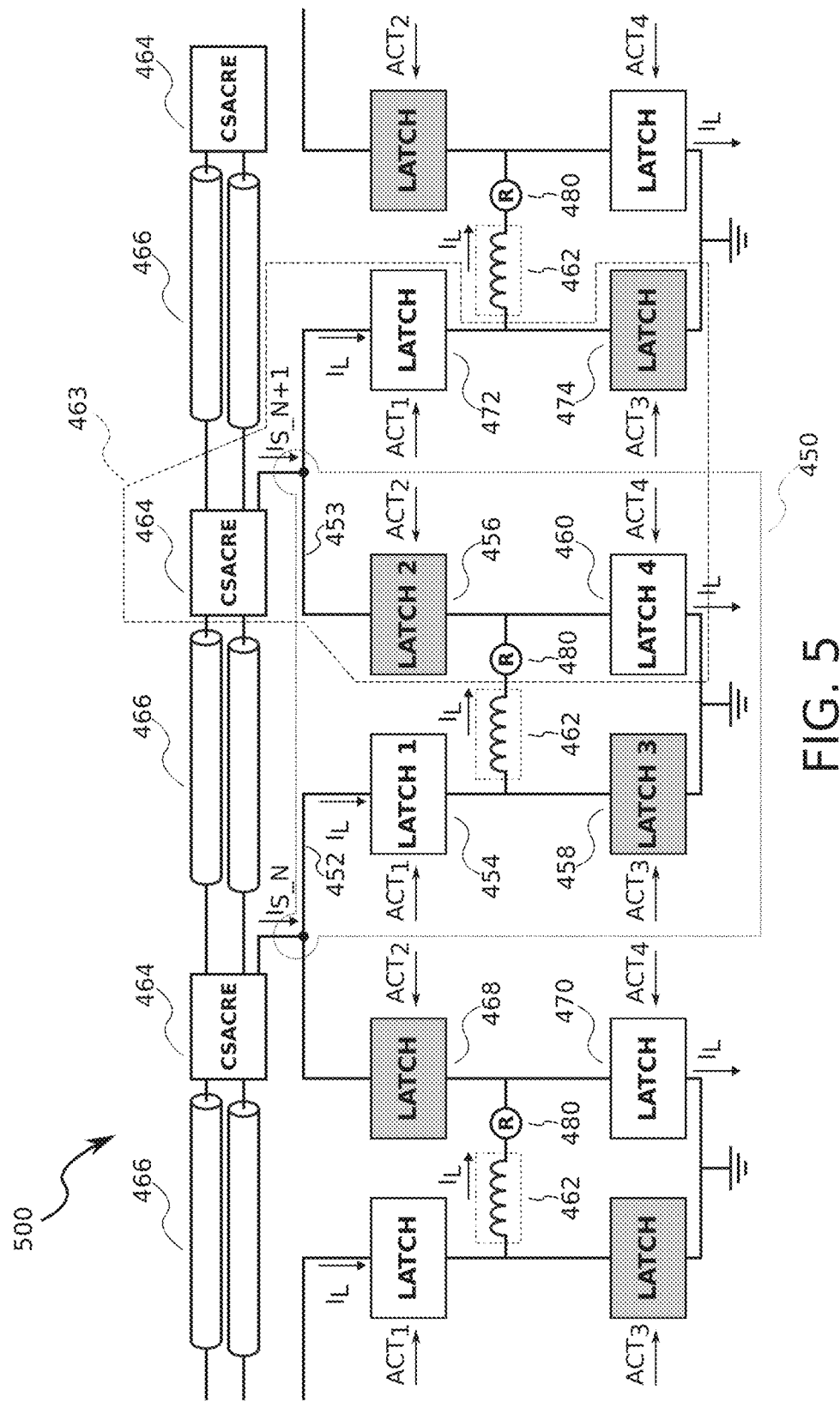
FIG. 5 is a schematic diagram depicting at least a portion of the illustrative superconducting distributed bidirectional current driver system shown in FIG. 4 configured for operation in a first current state, according to one or more embodiments of the invention.
Figure 6:
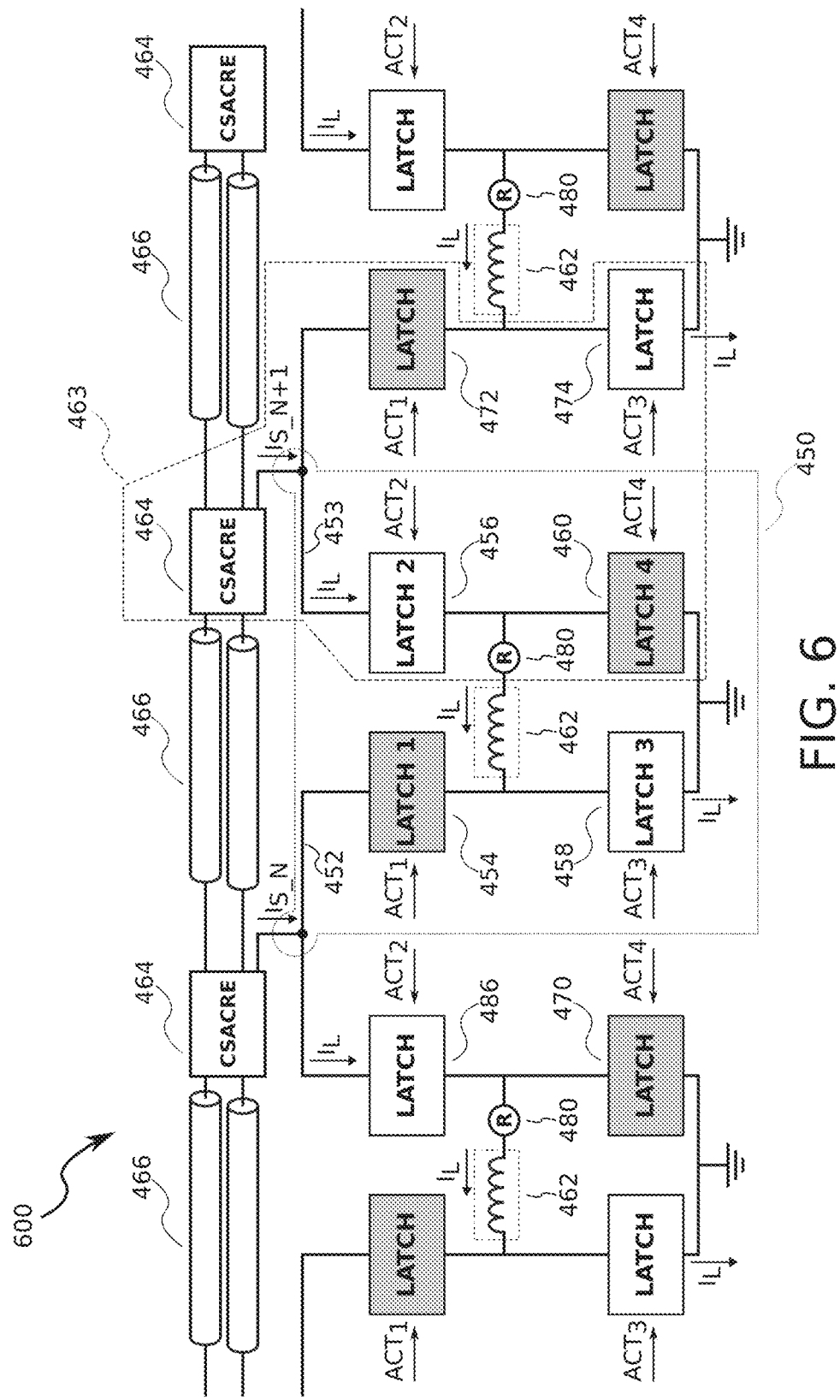
FIG. 6 is a schematic diagram depicting at least a portion of the illustrative superconducting distributed bidirectional current driver system shown in FIG. 4 configured for operation in a second current state, according to one or more embodiments of the invention.

More particularly, the bidirectional current driver core 450 includes a first superconducting latch 454 connected between node 452 and a first terminal of a bidirectional current load 462, illustrated as an inductor, a second superconducting latch 456 connected between node 453 and a second terminal of the bidirectional current load 462, a third superconducting latch 458 connected between the first terminal of the bidirectional current load 462 and ground, and a fourth superconducting latch 460 connected between the second terminal of the bidirectional current load 462 and ground. Connected in this manner, the superconducting latches are configured as an H-bridge circuit with respect to the bidirectional current load 462 (312 in FIG. 3). An optional superconducting reset latch (abbreviated R in FIG. 4) 480, which should be viewed as omitted (short circuited) for this first topological embodiment configured in an idle state, is shown connected between the second terminal of the bidirectional current load 462 and junctions of the second and fourth superconducting latches 456 and 460, respectively. The superconducting reset latch 480 is depicted in FIGS. 4, 5, and 6 to describe an alternative embodiment.

In the example of FIG. 4, the first superconducting latch 454 is activated via a first activation signal, ACT1. Likewise, the second superconducting latch 456 is activated via a second activation signal, ACT2, the third superconducting latch 458 is activated via a third activation signal, ACT3, and the fourth superconducting latch 460 is activated via a fourth activation signal, ACT4. In one or more embodiments, the activation signals ACT1, ACT2, ACT3, and ACT4 are generated by an activation controller (referred to herein as a current source, activation controller, and repeater element (CSACRE) 464, which will be discussed in further detail herein below, and supplied to the corresponding superconducting latches 454, 456, 458, 460.

The activation signals ACT1, ACT2, ACT3, ACT4 can be inductively coupled to the respective superconducting latches 454, 456, 458, and 460. For example, in one or more embodiments, the superconducting latches 454, 456, 458, and 460 are configured as quantum flux devices (e.g., SQUIDs or Josephson junction devices) that are configured to switch to a voltage state in response to the respective activation signals ACT1, ACT2, ACT3, and ACT4, such as based on a sequential alternate triggering of Josephson junctions. In some embodiments, the activation signals ACT1, ACT2, ACT3, and ACT4 can be provided as SFQ pulses or RQL pulses. In still other embodiments, the superconducting latches 454, 456, 458, and 460 can switch back to a superconducting state from the voltage state after expiration of a predetermined duration of time or when the amplitude of the latch current has dropped below a predetermined threshold.

FIG. 4 is intended to convey the distributed nature of the superconducting distributed bidirectional current driver system 310 of FIG. 3, according to embodiments of the invention. The superconducting distributed bidirectional current driver system 448 (310 in FIG. 3) is of comprises a plurality of distributed sections 463 ($322_N$, $322_{N+1}$ of FIG. 3). Each section 463 of the superconducting distributed bidirectional current driver system 448 preferably includes (i) a CSACRE 464, and (ii) the second and fourth superconducting latches 456 and 460 of an H-bridge circuit, and first and third superconducting latches 472 and 474, respectively, of an adjacent H-bridge circuit. More specifically, a repeater element (e.g., 324 in FIG. 3) for propagating control signals can include (i) a PTL driver within the first distributed section 463 in a chain of multiple distributed sections, (ii) a PTL driver and receiver in each of the middle sections 463 in a chain of multiple distributed sections sandwiched between first and last distributed sections, or (iii) a PTL receiver within a last distributed section 463 in a chain of multiple distributed sections.

The distributed sections 463 (or 322 in FIG. 3) can be linked together by a current-direction conductor (e.g., 330 in FIG. 3), a turn-on conductor (e.g., 332 in FIG. 3), and/or the bidirectional current load (load inductor in this example) 462 (bidirectional current load 312 in FIG. 3). The current-direction conductor (330 in FIG. 3) and the turn-on conductor (332 in FIG. 3) are collectively represented by control conductors 466 (e.g., a passive transmission lines PTLs) in FIG. 4. Within each distributed section 463, current-direction signals and turn-on signals, (transferred by the control network (i.e., 466, and the repeater in the CSACRE 464)) pass through any necessary delay elements to the activation controller (320 of FIG. 3), which drives the superconducting latches (318) that control the direction of load current IL. Only the turn-on enablement will be discussed herein, since the turn-off activity does not depend on data state (i.e., current-direction signals).

It is further contemplated that the current-direction signal propagated by 464 and 466 can also be propagated by at least one series-connected Josephson transmission lines (JTLs), as is known in the art.

It is notable that the control conductors 466 and the bidirectional current load 462 (e.g., write bit lines WBLs) are both considered to be substantially long, the bidirectional current load 462 spatially separating the first and third superconducting latches 454, 458 from the second and fourth superconducting latches 456, 460. Moreover, for memory applications, the schematic has been arranged to express a size relationship between the control conductors 466—a conductive section of a bit of a write bus line—and the bidirectional current load 462—e.g., a write bit line—wherein these two lines/conductors separate already noted components, as well as current source, activation controller, and repeater elements 464. What is not necessarily conveyed in FIG. 4 is that the bidirectional current load 462 and the control conductors 466 are similar in size for conventional arrays and arrays of memory systems (e.g., 100 of FIG. 1 and 200 of FIG. 2) in the present invention; actually the control conductors 466 are often the longer of the two components (462 and 466) in one or more embodiments.

Each of the distributed sections 463 associated with a read and write bit slice (110 in FIG. 1) can be integrated into the sense amplifiers, bit line write driver circuits, etc. blocks (106 in FIG. 1).

In a memory application, the control conductors 466 (preferably a transmission line) do more than simply carry a current-direction signal (which controls the application of a negative or positive magnetic field within an array 102 via current flowing in the write bit line WBL load) from one current source, activation controller, and repeater element 464 (for example, disposed within sense amplifiers, bit line write driver circuits, etc. 106 of FIG. 1) to the next current source, activation controller, and repeater element 464 (e.g., disposed above an intervening array (102 in FIG. 1) within sense amplifiers, bit line write driver circuits, etc. 106 of FIG. 1). Direction control conductors 466 interspersed between PTL repeater elements of the current source, activation controller, and repeater element 464, forms a bit of a write data bus that serves a plurality of arrays 102. With additional turn-on conductors as part of the control conductors, the bus can serve many sets of arrays 102, passing through one set and activating another.

From a physical design perspective, the control conductors 466 are preferably disposed vertically above wire/metal levels associated with the memory cells of the array (102 of FIG. 1) with perhaps an intervening ground plane.

In the example shown in FIG. 4, the bidirectional current driver core 450 is demonstrated in an idle state, such that no current flows through the bidirectional current load/inductor 462. By way of example, the bidirectional current driver core 450 can occupy the idle state at initialization of the bidirectional current driver core 450. The bidirectional current driver core 450 can be configured in a substantially balanced arrangement, and can thus have essentially zero resistance throughout based on being configured as superconducting. In the idle state, the superconducting latches 454, 456, 458, and 460 can all be superconducting (e.g., having zero resistance), and can thus be configured to conduct the input current substantially equally based on the balanced arrangement (particularly if the input currents $I_{S\_N}$ and $I_{S\_N+1}$ are set equal in value to one another). Thus, in the example of FIG. 4, the input currents $I_{S\_N}$ and $I_{S\_N+1}$ are divided across two of four current paths: (1) a first current path passing through the first superconducting latch 454 and the third superconducting latch 458; (2) a second current path passing through a second superconducting latch 468 and a fourth superconducting latch 470 in a preceding adjacent distributed section; (3) a third current path passing through the second superconducting latch 456 and the fourth superconducting latch 460; and (4) a fourth current path passing through the first superconducting latch 472 and the third superconducting latch 474 of a succeeding adjacent distributed section 463. The current through each of the current paths is represented as a current, $I_{L1}$ or $I_{L2}$, which is approximately equal to one half the amplitude of the corresponding input current $I_{S\_N}$ or $I_{S\_N+1}$, respectively.

By way of example only and without limitation, FIG. 5 is a schematic diagram depicting at least a portion of an exemplary memory circuit 500 including at least a portion of the illustrative superconducting distributed bidirectional current driver system 448 shown in FIG. 4 configured for operation in a first current state, according to one or more embodiments of the invention. More particularly, the circuit 500 demonstrates the bidirectional current driver core 450 operative in a first current state for controlling the input current $I_{S\_N}$ through the bidirectional current load/inductor 462. In the example of FIG. 3, the activation signals ACT2 and ACT3 have been provided to the receptive superconducting latches 456, 468 and 458, 474. Separate but logically equivalent activation signals ACTs (i.e., ACT$_2$ and ACT$_3$) are generated within each distributed section 322$_N$, 322$_{N+1}$ (463 in FIG. 4) of the superconducting distributed-bidirectional current driver system 310.

With reference to the illustrative scenario shown in FIG. 5, the activation signals ACT$_2$ and ACT$_3$ are provided to the bidirectional current driver core 450, as well as the superconducting latches 468 and 474 in the preceding and succeeding adjacent bidirectional current driver cores, respectively, having been in the idle state (e.g., configured as shown in FIG. 4) or having been in a second current state (e.g., having a current flow in the opposite direction). Therefore, in response to receiving the activation signals ACT$_2$ and ACT$_3$, the superconducting latches 456, 458, 468, and 474 switch to a voltage state (shaded superconducting latches in the example of FIG. 5), and thus cease to conduct portions of the input currents I$_{S\_N}$ and I$_{S\_N+1}$ (e.g., as the portions of currents I$_{L2}$ and I$_{L1}$, respectively, in the idle state or as the current I$_L$, which is derived from input current I$_{S\_N+1}$, from the second current state). As a result, the memory circuit 500 demonstrates a load current I$_L$ flowing through the bidirectional current load/inductor 462 that can have an amplitude that is approximately equal to the input current I$_{S\_N}$.

In the example shown in FIG. 5, the load current I$_L$ can depend on a total inductance of the current path through the non-activated superconducting latches 454, 460 and the bidirectional current load/inductor 462. Thus, the bidirectional current load/inductor 462 can be configured such that the load current I$_L$ flowing through the non-activated latches remains substantially equal to the amplitude of the current flowing through the superconducting latches 454, 458, 468 and 470 in the idle state, such as based on the current source in the CSACRE 464 (314N of FIG. 3, disposed to supply current I$_{S\_N}$) being configured as a flux pump.

Due to inherent latencies through the direction control conductors 466 and the PTL drivers and receivers of the CSACRE 464, each CSACRE preferably includes customizable delay elements (e.g., 326 of FIG. 3), which may be implemented using JTLs on different phases of a resonant clock, embedded within the activation controller that coordinates simultaneous application of a "logical" ACT signal, which represents all physical "ACT" signals, associated with one chain of distributed sections and terminator sections that form the superconducting distributed-bidirectional current driver system 448. As will be discussed in further detail herein below, in one or more alternative embodiments, a time-division multiplexing (TDM) scheme can be employed to distribute control signals for programming the current sources in at least a subset of the CSACRE blocks 464.

More particularly, in the example of FIG. 5, the load current I$_L$ is shown as flowing from the node 452 (e.g., from the current source 314$_N$, 314$_{N+1}$ in FIG. 3), through the non-activated (e.g., superconducting) superconducting latch 454, through the bidirectional current load/inductor 462 in a first direction, and through the non-activated superconducting latch 460, returning to the low-voltage rail. Therefore, in the example of FIG. 5, the superconducting latches 454 and 460 are referred to as first direction superconducting latches, since as they facilitate the flow of the load current I$_L$ through the bidirectional current load/inductor 462 in the first direction.

After a prescribed duration of time, the superconducting latches 456, 458, 468, and 474 return from the voltage state to the non-activated (e.g., superconducting) state. However, based on the superconducting (e.g., zero resistance) state of the superconducting latches 454 and 460, substantially all of the load current IL can continue to flow through the superconducting latches 454 and 460, and through the bidirectional current load/inductor 462 in the first direction in the first current state (e.g., a hold state). In the first current state, or hold state, the current I$_L$ can maintain a flux of <D with respect to the bidirectional current load/inductor 462, and can continue to flow essentially indefinitely due to the superconducting configuration of the bidirectional current driver 450.

FIG. 6 is a schematic diagram 600 depicting at least a portion of the illustrative superconducting distributed bidirectional current driver system 448 shown in FIG. 4 configured for operation in a second current state, according to one or more embodiments of the invention. The diagram 500 demonstrates the bidirectional current driver core 450 operative in a second current state for controlling the input current I$_{S\_N}$ through the bidirectional current load/inductor 462. A direction of the load current I$_L$ through the bidirectional current load/inductor 462 in the second state is opposite the direction of the load current I$_L$ passing through the bidirectional current load/inductor 462 in the first state.

With reference to FIG. 6, the activation signals ACT$_1$ and ACT$_4$ have been provided to the superconducting latches 454 and 460. As an example, the activation signals ACT$_1$ and ACT$_4$ can be provided to the bidirectional current driver core 450 having been in the idle state (e.g., as in the example of FIG. 4) or having been in the first current state (e.g., as in the example of FIG. 5). Therefore, in response to receiving the activation signals ACT$_1$ and ACT$_4$, the superconducting latches 454 and 460 switch to the voltage state (shown in FIG. 6 as shaded superconducting latches), and thus cease to conduct the input current (e.g., as the portions of currents I$_{L2}$ and I$_{L1}$, respectively, in the idle state or as the current I$_L$, which is derived from input current I$_{S\_N+1}$, from the first current state). As a result, the diagram 600 demonstrates the load current I$_L$ flowing through the bidirectional current load/inductor 462 that can have an amplitude that is approximately equal to the input current I$_{S\_N+1}$, and having a negative amplitude relative to the load current I$_L$ in the example of FIG. 5.

More particularly, in the example of FIG. 6, the load current I$_L$ flows from node 453 (e.g., from the current sources 314$_N$, 314$_{N+1}$), through the non-activated (e.g., superconducting) superconducting latch 456, through the bidirectional current load/inductor 462 in a second direction (opposite the first direction), and through the non-activated superconducting latch 458, returning to the low-voltage rail (shown here as ground). Therefore, the superconducting latches 456 and 458 are referred to as second direction superconducting latches, since they facilitate the flow of the load current I$_L$ through the bidirectional current load/inductor 462 in the second direction.

After a prescribed duration of time, the superconducting latches 454 and 460 return from the voltage state to the non-activated (i.e., superconducting) state. However, based on the superconducting (i.e., zero resistance) state of the superconducting latches 456 and 458, substantially all of the load current I$_L$ will continue to flow through the superconducting latches 456 and 458, and through the bidirectional current load/inductor 462 in the second direction in the second current state (e.g., a hold state). In the second current state, or hold state, the current I$_L$ can maintain a flux of Φ with respect to the bidirectional current load/inductor 462, and this current can continue to flow indefinitely due to the superconducting configuration of the bidirectional current driver core 450.

As previously mentioned, a superconducting reset latch (R) 480 may be optionally included in the superconducting distributed bidirectional current driver system (448 in FIG. 4) in accordance with one or more alternative embodiments; the superconducting reset latch 480 is shown in FIGS. 4-6. The superconducting reset latch 480, when included in the bidirectional current driver core 450, provides yet another feature described in further detail herein below. The bidirectional current driver core 450 with superconducting reset latch 480 can correspond to the superconducting bidirectional current driver $316_N$ in FIG. 3, and therefore reference will be made to FIG. 3 in the following description.

When the superconducting reset latch 480 is included in the bidirectional current driver core 450, it is preferably connected in series with the bidirectional current load/inductor 462. For example, as shown in FIGS. 4-6, the superconducting reset latch 480 is connected between the second terminal of the bidirectional current load/inductor 462 and a junction of the second and fourth superconducting latches 456 and 460, respectively. It is to be appreciated, however, that the superconducting reset latch 480 can be connected on the other side of the bidirectional current load/inductor 462 as well (i.e., between the bidirectional current load/inductor 612 and the junction of superconducting latches 454 and 458). (In one or more embodiments, multiple superconducting reset latches may be employed, e.g., connected on both sides of the bidirectional current load/inductor 462.)

The bidirectional current driver core 450 with superconducting reset latch 480 can be configured similar to the bidirectional current driver core without the superconducting reset latch in the examples previously discussed with respect to FIGS. 4-6. Specifically, the bidirectional current driver core 450 with superconducting reset latch 480 can be switched from its idle state to one of the first and second current states in a manner consistent with the operation described previously in the example scenarios of FIGS. 4-6, respectively. The superconducting reset latch 480 is configured to receive an activation signal, ACTR, such as from the activation controller 320 in FIG. 3, to reset the bidirectional current driver core 450 from the first current state or the second current state back to the idle state.

As an example, in a non-activated state, the superconducting reset latch 480 is superconducting to provide a zero-resistance current path for the load current $I_L$ in either the first or the second current states. In response to receiving the activation signal ACTR, the superconducting reset latch 480 can be configured to switch to the voltage state to cease current flow (e.g., provide resistance) in the current path of the load current $I_L$ through the bidirectional current load/inductor 462. Accordingly, based on the balanced arrangement of the bidirectional current driver core 450 with superconducting reset latch 480, the load current $I_L$ is diverted from the current path through the bidirectional current load/inductor 462 and the superconducting reset latch 480, and thus the input currents $I_{S\_N}$ and $I_{S\_N+1}$ become divided at the input nodes 452, 453. As a result, the input currents $I_{S\_N}$ and $I_{S\_N+1}$ flow substantially equally as the current $I_{L1}$ through the respective current paths of the superconducting latches 454, 458 and 468, 470, and as the current $I_{L2}$ through the superconducting latches 456, 460 and 472, 474 when $I_{S\_N}$ is set equal to $I_{S\_N+1}$. Therefore, the bidirectional current driver core 450 with reset latch 480 is set to the idle state from the first current state or the second current state.

Alternative embodiments of the superconducting distributed bidirectional current driving system (e.g., 448 of FIG. 4 and 310 of FIG. 3) are similarly contemplated and are within the scope of embodiments of the invention. For example, to explain the operation of the bidirectional current driver core 450 that uses inductors (shown in FIG. 7) in place of the top superconducting latches (e.g., LATCH1 and LATCH2), the similar reference numbers will be used, and the activation control signal inputs previously supplied to those top superconducting latches (i.e., superconducting latches 454, 456, 468, and 472 having $ACT_1$ and $ACT_2$ inputs) will be omitted since the inductors, now 754, 756, 768, and 772, function without such control signals. For the sake of the discussion of this alternative embodiment, in terms of terminology, superconducting latch 454 (LATCH1) becomes inductor 754 (without the $ACT_1$ input). Also, only the first current direction will be explained, as its standby and its second current direction operation will become apparent to those skilled in the art given the teachings herein (and in light of U.S. Pat. No. 10,122,351 to Naaman et al.).

Figure 7:
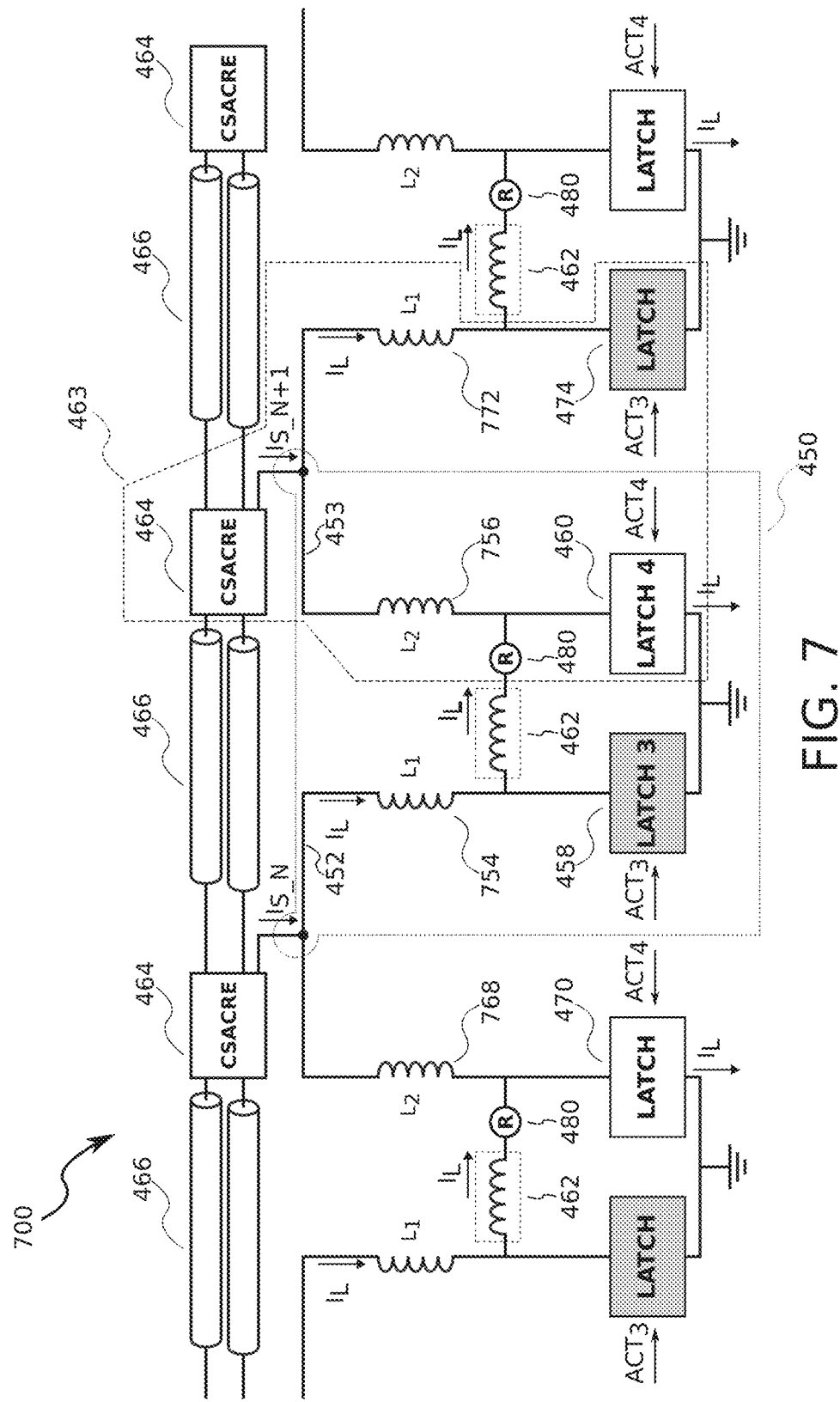
FIG. 7 is a schematic diagram depicting at least a portion of the illustrative superconducting distributed bidirectional current driver system shown in FIG. 4 that uses a combination of superconducting latches and inductors to distribute bidirectional currents through a multiplicity of conductors (e.g. write bit lines), according to one or more embodiments of the present invention.

More particularly, FIG. 7 is a schematic diagram 700 depicting at least a portion of the illustrative superconducting distributed bidirectional current driver system 448 shown in FIG. 4 wherein some of its superconducting latches (top latches) are replaced with inductors to form an A-bridge connection arrangement, according to one or more embodiments of the invention. The diagram 700 of FIG. 7 shows a first current state of the input current $I_{S\_N}$ through the bidirectional current load/inductor 462. The activation signal $ACT_3$, which may be generated by an activation controller (e.g., $320_N$, $320_{N+1}$ of FIG. 3) is provided to the respective superconducting latches 458, 474. Separate but logically equivalent activation signals ACTs (e.g., $ACT_3$) are preferably generated within each distributed section 463 of the superconducting distributed bidirectional current driver system.

As an example, the activation signal ACT3 can be provided to the bidirectional current driver core 450 (i.e., to superconducting latch 458 (LATCH3)), as well as to the superconducting latch 474 (LATCH) in the adjacent distributed section, having been in the idle state (e.g., as in the example of FIG. 4) or having been in a second current state (e.g., having a current flow in the opposite direction). Therefore, in response to receiving the activation signal $ACT_3$, the superconducting latches 458, 474 switch to the voltage state (shown as shaded superconducting latches in the example of FIG. 7), and thus cease to conduct portions of input currents $I_{S\_N}$ and $I_{S\_N+1}$. As a result, diagram 700 demonstrates a load current IL flowing through the bidirectional current load/inductor 462 that can have an amplitude that is approximately equal to the input current $I_{S\_N}$.

Other alternative embodiments of the distributed bidirectional current driver core/section 450/463 are contemplated according to embodiments of the invention. For example, the bidirectional current drivers described in U.S. Pat. No. 10,122,351 to Naaman et al. may be suitable for use with embodiments of the invention, with or without modification, as will become apparent to those skilled in the art.

Figure 8:
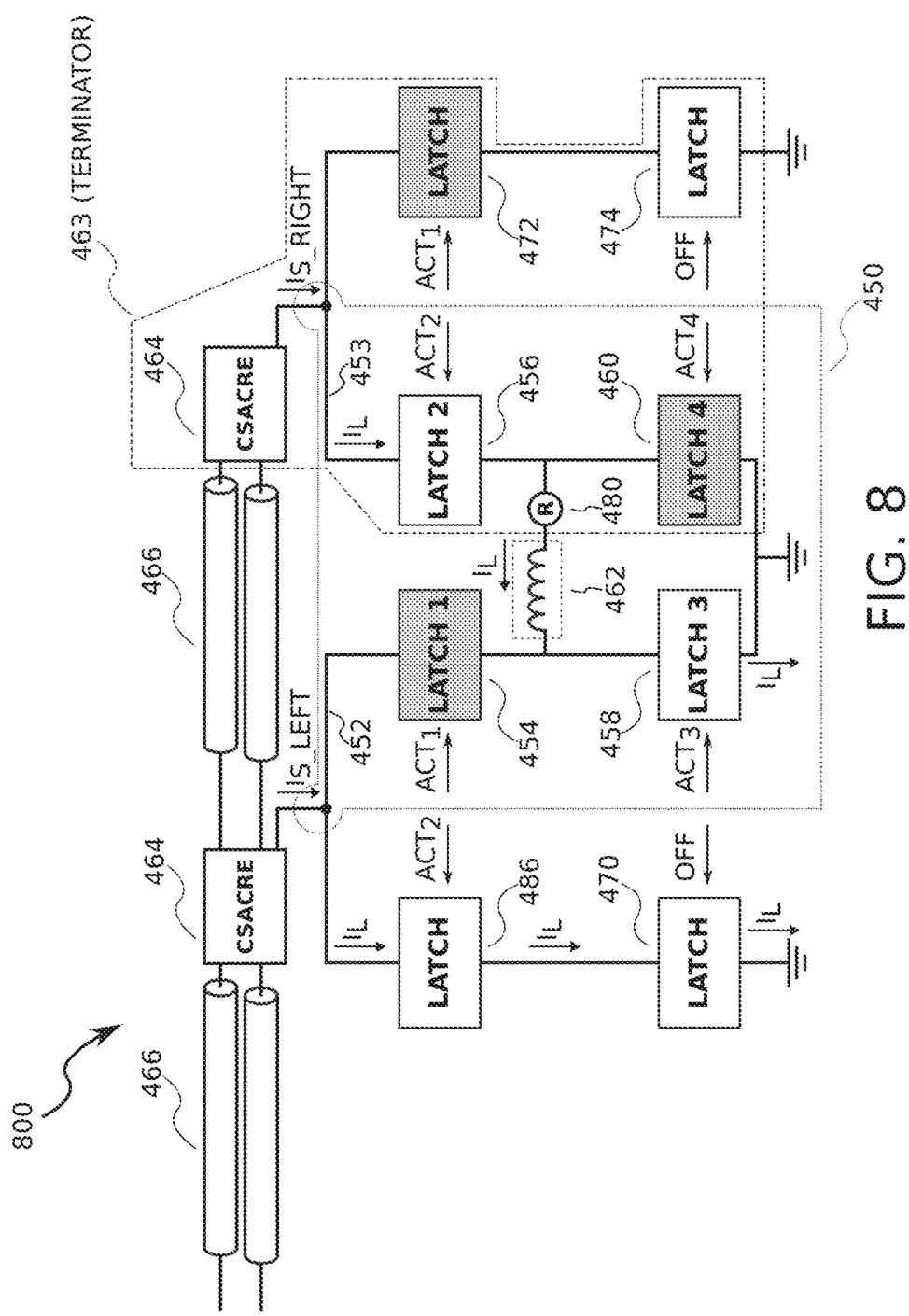
FIG. 8 is a schematic diagram depicting at least a portion of the illustrative superconducting distributed bidirectional current driver system of FIG. 4 having two terminator sections that drive a bidirectional current through a bidirectional current load, according to one or more embodiments of the present invention.

As previously stated, embodiments of the invention contemplate that a terminator (e.g., 328 in FIG. 3) can be formed by altering a distributed section (e.g., $322_N$, $322_{N+1}$ in FIG. 3) so that it only connects to a bidirectional current load (e.g., $312_N$) on one of its sides, and its internally-generated activation signals, ACTS, direct the input current $I_{S\_N}$, $I_{S\_N+1}$ appropriately, depending on data state, through the bidirectional current load $312_N$ on one of its sides or through, for example, a second stack of two superconducting latches 318 (see FIG. 3). FIG. 8 is a schematic diagram 800 depicting at least a portion of the illustrative superconducting distributed bidirectional current driver system of FIG. 4, modified to include two terminator sections that drive a bidirectional current through a bidirectional current load, according to one or more embodiments of the invention.

Specifically, FIG. 8 conceptually depicts one way of configuring the distributed section 463 to form a terminator section (i.e., terminator). With reference to FIG. 8, each distributed section 463 is altered so that it only connects to a bidirectional current load 462 (e.g., 312 of FIG. 3) on one of its sides. The right distributed section 463, for example, connects at the midpoint of a first stack of two superconducting latches 456, 460. Its internally generated ACT signals can direct input current $I_{S\_Right}$ appropriately, depending on data state, through the bidirectional current load 462 on its left side. A flow of load current $I_L$ from right to left should suffice: by enabling $ACT_4$ and $ACT_1$, current $I_{S\_Right}$ flows through the superconducting latch (LATCH2) 456 of the modified distributed section 463 (terminator), through the load 462, and then through the superconducting latch (LATCH3) 458 (of the left-hand-side modified distribution section 463 (terminator, not actually enclosed by dashed lines and labeled)). As further shown in FIG. 8, the other input current $I_{S\_Left}$ is directed through superconducting latches (LATCH) 468 and 470.

Other embodiments of terminator circuits are contemplated, according to alternative embodiments of the invention, which introduce more symmetry in the terminator circuits. For example, in addition to the elements already depicted in FIG. 8, load inductors of equal value to the bidirectional current load 462 can be disposed the first between superconducting ground and the node connecting latches 468 and 470, and the second between superconducting ground and the node connecting latches 472 and 474.

A Time-Division Demultiplexing Scheme for Writing Data into Memory Cells within an Array Advantageously, in order to reduce wiring congestion in the superconducting memory array, among other advantages, one or more embodiments of the invention provide a novel time-division demultiplexing architecture for writing data into and/or reading data from memory cells within the array. A novel approach for writing data into the memory cells using time-division multiplexing will now be described, according to one or more embodiments. Managed by various write control signals, a time-division multiplexing scheme for writing data into the memory cells receives write data signals (and write control signals) from a write data bus and, for JMRAM or JMRAM like memories specifically (e.g. FIGS. 9A-9D describe the time-division multiplexing), latches those write data signals on particular cycles (e.g., specified by one or more demultiplexer write control signals) as circulating currents in a subset of bit write superconducting loops associated with the array of memory cells. Each bit write superconducting loop, in one or more embodiments, includes a write bit line (WBL) conductor, a bit line write driver circuit, and preferably a superconducting ground conductor.

It should be understood that, in general analog applications, a time-division demultiplexing scheme using one datum line can be used to distribute the current signs/directions (either positive/negative or right/left) for multiple superconducting distributed bidirectional current driver systems (e.g., depicted as 310 in FIG. 3). JMRAM is only one exemplary application, which exploits superconducting distributed bidirectional current driver systems. Thus, in another contemplated application, the bidirectional currents can provide unique flux bias signals to a set of qubits.

Figure 9A:
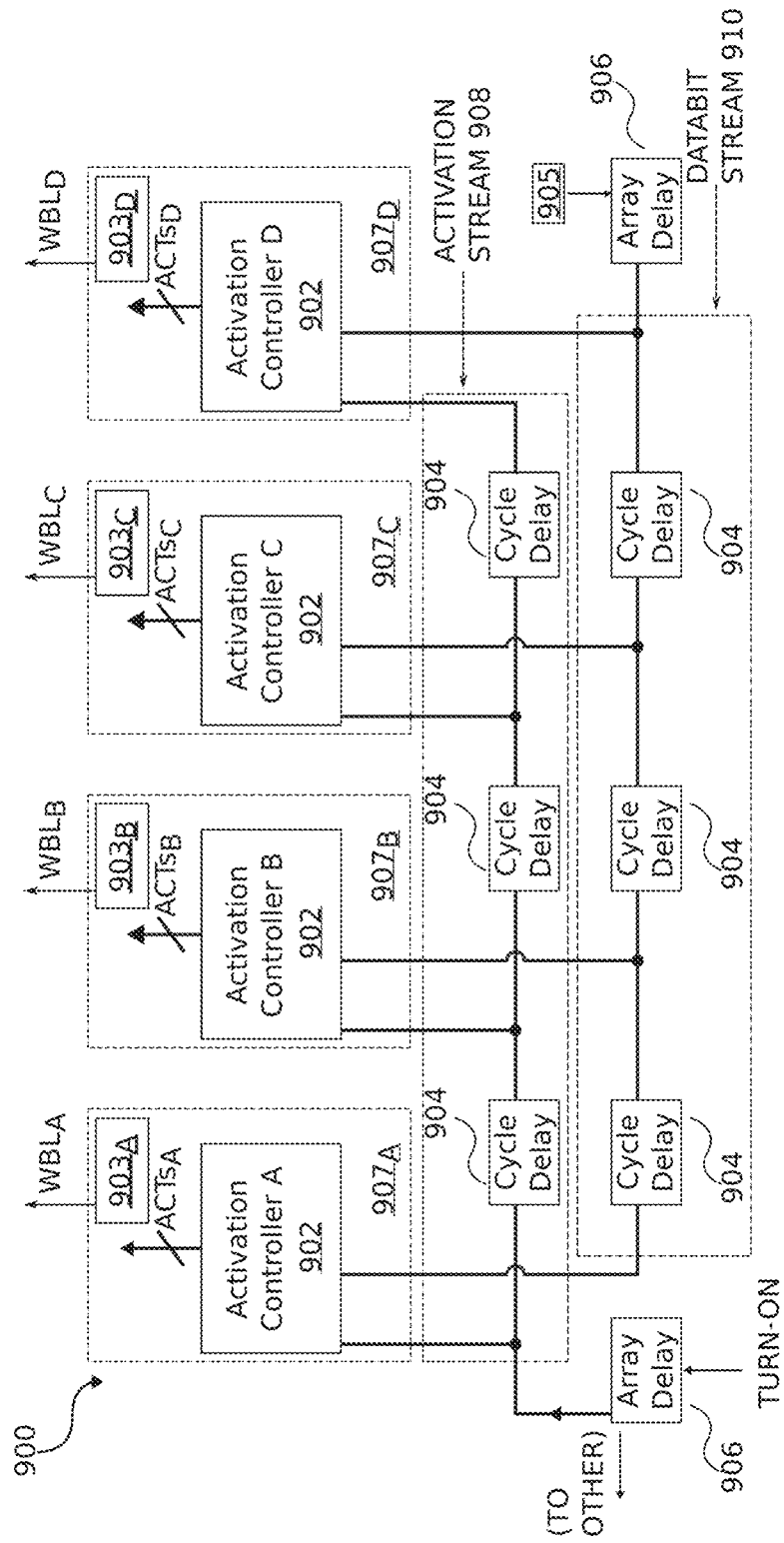
FIG. 9A is a block diagram conceptually depicting a time-division demultiplexing write bus element for generating activation signals in a time-division demultiplexing scheme, according to one or more embodiments of the invention.
Figure 9B:
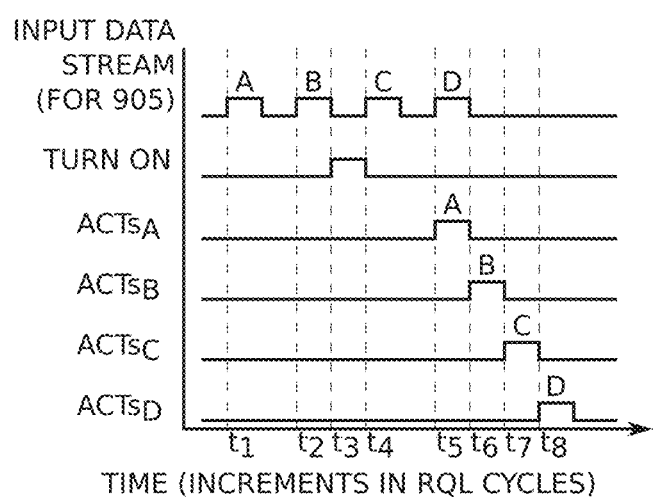
FIG. 9B is a timing diagram conceptually depicting illustrative signals generated by the exemplary time-division demultiplexing write bus element shown in FIG. 9A, according to one or more embodiments of the invention.
Figure 9C:
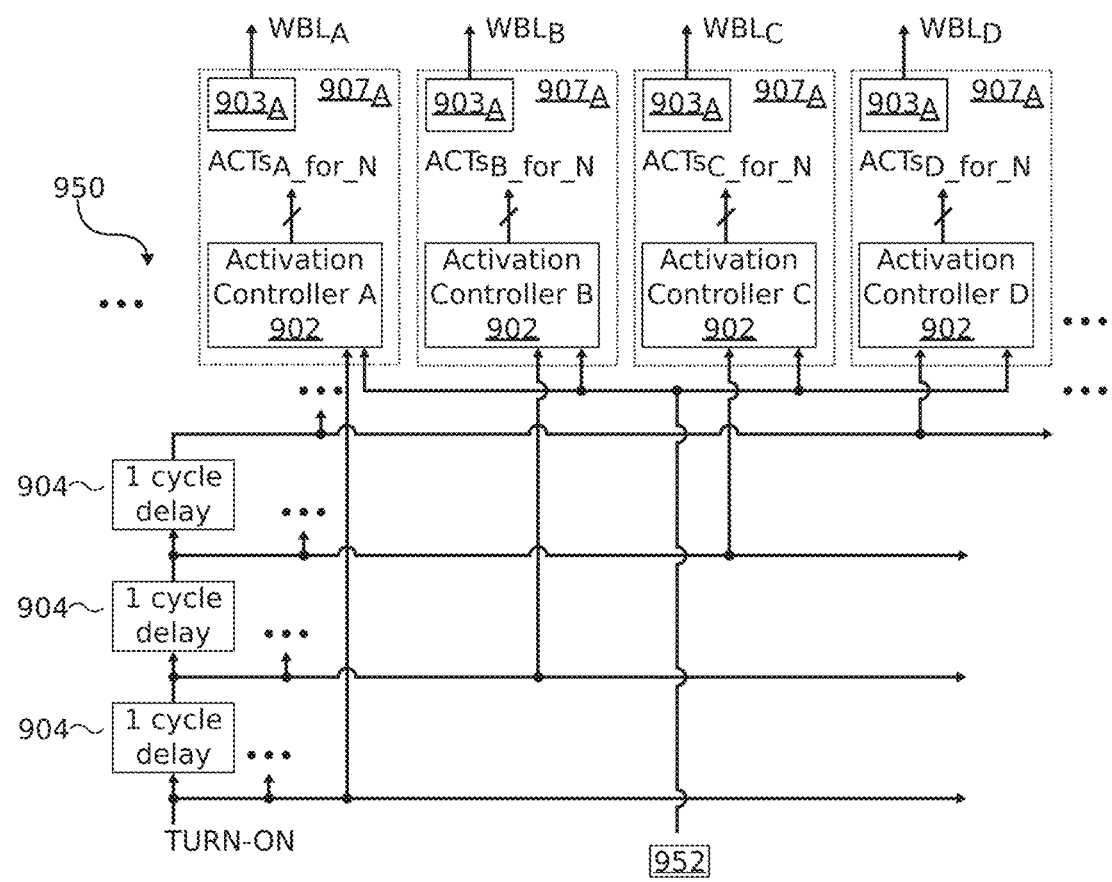
FIGS. 9C and 9D are a block diagram and corresponding timing diagram, respectively, conceptually depicting a time-division demultiplexing write bus element for generating activation signals in a time-division demultiplexing scheme, according to one or more alternative embodiments of the invention.

To form a time-division demultiplexed write bus element according to one or more embodiments of the invention, FIGS. 9A and 9C, and 7 require the addition of a PTL drivers and PTL receivers, one pair for each required local fan-out/signal (i.e. "turn-on" and "1 bit data stream.").

The first distinct time-division demultiplexing system embodiments for JMRAM (or JMRAM-like memories) will be described with reference to FIGS. 9A through 9D. As will be discussed subsequently, towards the end of the Detailed Description in the section devoted to system and memory architecture, it should be noted that a write operation to JMRAM (or JMRAM-like memories) generally requires a minimum overlap time for (i) address-based magnetic fields (i.e., hard-axis fields), directed to selecting the write selected set of memory cells to be written, and (ii) data-based magnetic fields, or torques, (i.e., easy-axis fields or torques). The subsequent discussion concerning the first time-division demultiplexing system/scheme primarily pertains to writing data to its unique "latching" write bit line driver circuits, and retaining the data therein until the write operation completes. (In the figures, only the activation controllers appear because they form the front end of the write bit line driver circuits, as will be understood from the discussions of FIGS. 9A and 9B).

Returning now to the discussion of JMRAM (or JMRAM-like memories), FIG. 9A is a block diagram conceptually depicting at least a portion of a time-division demultiplexing write bus element 900 for generating activation signals in a time-division demultiplexing scheme, according to one or more embodiments of the invention. The time-division demultiplexing write bus element 900 includes a plurality of activation controllers 902. Although there are four activation controllers 902 shown (i.e., activation controllers A, B, C and D), each generating a respective activation signals (i.e., $ACTs_A$, $ACTs_B$, $ACTs_C$, and $ACTs_D$), it is to be appreciated that embodiments of the invention are not limited to any specific number of activation controllers.

For JMRAM, for example, the activation controllers A, B, C, D 902 generate $ACTs_A$, $ACTs_B$, $ACTs_C$, and $ACTs_D$. These ACTs control the sign of the current driven by their associated bidirectional current driver $903_A$, $903_B$, $903_C$, and $903_D$. Depending on the ACTs, the current for each bidirectional current driver can be a positive or negative value. These positive or negative write currents are driven through the write bit lines (e.g., $WBL_A$, $WBL_B$, $WBL_C$, $WBL_D$) to write one of their associated memory cells, which is write selected, to a specific state. Collectively, ACT circuits and a bidirectional current driver circuits form write bit line driver circuits $907_A$, $907_B$, $907_C$, and $907_D$, each of which drives a signal through its associated write bit line, either $WBL_A$, $WBL_B$, $WBL_C$, or $WBL_D$, to a write selected memory cell to a specified state.

With continued reference to FIG. 9A, the time-division demultiplexing write bus element 900 further includes a plurality of cycle delay elements 904, each of the cycle delay elements being configured to generate a one cycle delay, and a plurality of array delay elements 906. A first one of the array delay elements 906 is adapted to receive a turn-on signal (Turn-On) and to generate a buffered output enable signal used for enabling the activation controllers 902. The enable signal generated by the first array delay element 906 is supplied directly to a first one of the activation controllers 902 (Activation Controller A) without passing through any cycle delay elements 904. This enable signal can be propagated to other activation controllers in the array for a second (or more) one-bit data stream.

The non-delayed enable signal generated by the first array delay element 906 is passed through a first one of the cycle delay elements 904 to generate a first delayed enable signal, which is supplied to a second one of the activation controllers 902 (Activation Controller B). This first delayed enable signal is also passed through a second one of the cycle delay elements 904 to generate a second delayed enable signal, which is supplied to a third one of the activation controllers 902 (Activation Controller C). Likewise, the second delayed enable signal is also passed through a third one of the cycle delay elements 904 to generate a third delayed enable signal, which is supplied to a fourth one of the activation controllers 902 (Activation Controller D). Collectively, the non-delayed enable signal, along with the first, second and third delayed enable signals, and the corresponding cycle delay elements 904 used to generate the delayed enable signals, form an activation stream 908.

A second one of the array delay elements 906 is adapted to receive an input data stream 905 and to generate a buffered data stream presented to the activation controllers 902. The input data stream is delivered to the data stream input 905 is delivered by one bit of a write bus (e.g., 114 in FIG. 1) and supplies serial data to a datum input of the activation controllers 902 every other cycle, in one or more embodiments. The buffered data stream generated by the second array delay element 906 is supplied directly to the fourth activation controller 902 (Activation Controller D) without passing through any cycle delay elements 904. The non-delayed data stream generated by the second array delay element 906 is also passed through a fourth one of the cycle delay elements 904 to generate a first delayed data stream, which is supplied to third activation controller 902 (Activation Controller C). This first delayed data stream is also passed through a fifth one of the cycle delay elements 904 to generate a second delayed data stream, which is supplied to the second activation controller 902 (Activation Controller B). Likewise, the second delayed data stream is also passed through a sixth one of the cycle delay elements 904 to generate a third delayed data stream, which is supplied to the first activation controller 902 (Activation Controller A). Collectively, the non-delayed data stream, along with the first, second and third delayed data stream signals, and the corresponding cycle delay elements 904 used to generate the delayed data stream signals, form a databit stream 910.

FIG. 9B is a timing diagram conceptually depicting illustrative signals generated by the exemplary time-division demultiplexing write bus element 900 shown in FIG. 9A, according to one or more embodiments of the invention. As apparent from FIG. 9B, a first datum (A) is presented on write bus at time t1, a second datum (B) is presented on the write bus at time t2, two RQL cycles later, a third datum (C) is presented on write bus at time t4, four RQL cycles later, and a fourth datum (D) is presented on the write bus at time t5, six RQL cycles later. A turn-on signal is activated at time t3, between the presentation of datum B and datum C on the write bus. Using the delayed enable signals generated by the activation stream 908 (see FIG. 9A), the data will be output by the respective activation controllers sequentially every RQL cycle beginning at time t5. Specifically, the ACTs (i.e. $ACTs_A$) associated with generating the writes currents for datum A will be output by activation controller A at time t5, the ACTs (i.e. $ACTs_B$) associated with generating the writes currents for datum B will be output by activation controller B at time t6, the ACTs (i.e. $ACTs_C$) associated with generating the writes currents for datum C will be output by activation controller C at time t7, and the ACTs (i.e. $ACTs_D$) associated with generating the writes currents for datum D will be output by activation controller D at time t8. It is to be appreciated that the delay scheme shown in FIG. 9A is designed for four activation controllers, which require an activation controller delay of three RQL cycles. However, for different activation controller latencies, the number of cycle delay elements used can be easily modified so that the output data generated by the activation controllers are synchronized.

Figure 9D:
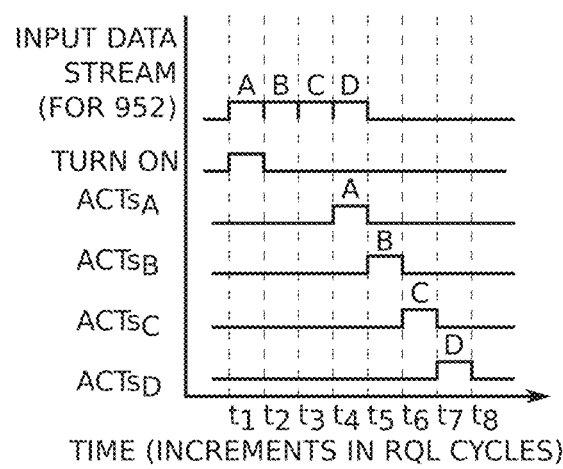

FIGS. 9C and 9D are a block diagram and corresponding timing diagram, respectively, conceptually depicting a time-division demultiplexing write bus element 950 for generating activation signals in a time-division demultiplexing scheme, according to one or more alternative embodiments of the invention. The time-division demultiplexing write bus element 950 beneficially reduces the number of cycle delay elements 904 required (which can be amortized across an entire write data path) and eliminates the array delay elements (906 in FIG. 9A), compared to the illustrative time-division demultiplexing write bus element 900 shown in FIG. 9A. Thus, the time-division demultiplexing write bus element 950 adds no latency to each data path extending from the one-bit per cycle data stream to each activation controller 902.

With reference to FIG. 9C, the time-division demultiplexing write bus element 950 includes a plurality of activation controllers (A, B, C and D) 902 and a plurality of cycle delay elements 904. In a manner consistent with the activation controllers shown in FIG. 9A, each of the activation controllers 902 includes an enable input for receiving an enable/activation signal, a datum input for receiving a datum from an input data stream is delivered to the data stream input 952 delivered by one bit of a write data bus (bits in the stream arriving every RQL cycle), and an output for generating corresponding activation signals, ACTs. In this illustrative embodiment, the datum inputs of the respective activation controllers 902 are coupled together to one bit of the write data bus.

The cycle delay elements 904 in this embodiment are connected together in series and generate increasingly delayed versions of the turn-on signal supplied to the time-division demultiplexing write bus element 950. More particularly, the turn-on signal is supplied directly to the enable input of activation controller A 902 and also to an input of the first cycle delay element. The output of the first cycle delay element 904, which represents a one-cycle delayed version of the turn-on signal, is supplied to the enable input of the second activation controller B 902 and also to the input of the second cycle delay element 904. The output of the second cycle delay element 904, which represents a two-cycle delayed version of the turn-on signal, is supplied to the enable input of the third activation controller C 902 and also to the input of the third cycle delay element 904. The output of the third cycle delay element 904, which represents a three-cycle delayed version of the turn-on signal, is supplied to the enable input of the fourth activation controller D 902. Preferably, all of the delayed versions of the turn-on signal are propagated to one or more other activation controllers associated with a different bit of the write data bus (as represented by the arrows extending horizontally to the right in FIG. 9C).

With the time-division demultiplexing write bus element 950 shown in FIG. 9C, each cycle a datum can be presented for four consecutive cycles via the one bit per cycle data stream 952 for storage of data through the activation controllers 902, which control the activation controllers 902 that generate $ACTs_A$, $ACTs_B$, $ACTs_C$, and $ACTs_D$. As already noted, these ACTs drive the bidirectional current drivers that define the positive or negative write currents driven through the write bit lines (e.g., $WBL_A$, $WBL_B$, $WBL_C$, $WBL_D$) to write the write-selected memory cells to a specific states. Advantageously, the latency and cycle times to write data into the memory cells using this time-division demultiplexing scheme is only increased by three cycles, which is preferable to the six cycle delay incurred by the illustrative embodiment shown in FIGS. 9A and 9B. The number of required one cycle delay elements is reduced by six for each set of four write bit lines WBLs.

With reference now FIG. 9D, a timing diagram shows, at times t1 through t4, presenting a data burst to the data stream input 952 including four datums (DatumA, DatumB, DatumC, DatumD) on the bit of the write data bus, with a different datum being presented every consecutive RQL cycle. This approach is different from the time-division demultiplexing write bus element 900 shown in FIGS. 9A and 9B, wherein datums were presented on the write data bus every other RQL cycle (delivered by 1 Bit of a Write Bus to the data stream input 905). The turn-on signal is also activate at time t1, concurrently with the presentation of the first datum (DatumA). After a delay of about three RQL cycles (cycles are only illustrative . . . they do not necessarily represent the delay of the activation controller), indicative of an activation controller delay (i.e., latency), the first activation controller A 902 outputs the ACTs (i.e. $ACTs_A$) associated with generating the writes currents for the first datum (DatumA) at time t4, followed by the second activation controller B 902 outputting the ACTs (i.e. $ACTs_B$) associated with generating the writes currents for the second datum (DatumB) at time t5, the third activation controller C 902 outputting the ACTs (i.e. $ACTs_C$) associated with generating the writes currents for the third datum (DatumC) at time t6, and the fourth activation controller D 902 outputting the ACTs (i.e. $ACTs_D$) associated with generating the writes currents for the fourth datum (DatumD) at time t7.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary structures or devices illustrated in the accompanying figures, or portions thereof, may be part of an integrated circuit. Integrated circuits so manufactured are considered part of this invention.

Those skilled in the art will appreciate that the exemplary devices, structures and circuits discussed above can be distributed in raw form (i.e., a single wafer having multiple unpackaged chips), as bare dies, in packaged form, or incorporated as parts of intermediate products or end products that benefit from a memory formed in accordance with one or more embodiments of the invention, such as, for example, JMRAM, etc.

An integrated circuit in accordance with aspects of the present disclosure can be employed in essentially any memory application and/or electronic system. Suitable systems for implementing embodiments of the invention may include, but are not limited to, computing systems, etc. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. The term "and/or" is intended to include either of associated items, taken alone, or any combination of one or more of the associated items. Thus, for example, the phrase "A, B and/or C" as used herein is intended to mean only A, or only B, or only C, or any combination of A, B and C. Terms such as "above" and "below" are used to indicate relative positioning of elements or structures to each other as opposed to relative elevation.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus, the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A superconducting distributed bidirectional current driver circuit for selectively steering current in one of first and second directions through at least one bidirectional current load, the superconducting distributed bidirectional current driver circuit comprising:
a plurality of bidirectional current drivers, the at least one bidirectional current load being operatively coupled between two adjacent bidirectional current drivers of the plurality of bidirectional current drivers, each of the bidirectional current drivers comprising:
a first superconducting latch circuit configured to convey current through the bidirectional current load as a function of at least a first activation signal applied thereto; and
a second superconducting latch circuit configured to convey current through a bidirectional current load associated with an adjacent one of the plurality of bidirectional current drivers as a function of at least a second activation signal applied thereto,
wherein the first superconducting latch circuit in a first one of the bidirectional current drivers operatively coupled to the bidirectional current load and the second superconducting latch circuit in a second one of the bidirectional current drivers operatively coupled to the bidirectional current load are selectively activated by the first and second activation signals, respectively, to establish a first current path of a first input current, supplied to the first one of the bidirectional current drivers, through the bidirectional current load in a first direction, and
wherein the second superconducting latch circuit in the second one of the bidirectional current drivers operatively coupled to the bidirectional current load and the first superconducting latch circuit in the first one of the bidirectional current drivers operatively coupled to the bidirectional current load are selectively activated by the second and first activation signals, respectively, to establish a second current path of a second input current, supplied to the second one of the bidirectional current drivers, through the bidirectional current load in a second direction opposite the first direction.

2. The circuit according to claim 1, wherein each of the first and second superconducting latch circuits in at least a subset of the plurality of bidirectional current drivers is configured as a quantum flux device activated in response to the first and second activation signals, respectively, provided from a corresponding activation controller to set the respective first superconducting latch circuit or second superconducting latch circuit to a voltage state in response to triggering of at least one Josephson junction.

3. The circuit according to claim 1, wherein two adjacent superconducting bidirectional current drivers of the plurality of superconducting bidirectional current drivers are connected to form respective legs in an H-bridge circuit operatively coupled to the bidirectional current load, wherein the first superconducting latch circuit in a first adjacent superconducting bidirectional current driver comprises a first superconducting latch operatively coupled between a corresponding first current source and a first end of the bidirectional current load, and a second superconducting latch coupled between the first end of the bidirectional current load and a low-voltage rail, and wherein the second superconducting latch circuit of a second adjacent bidirectional current driver comprises a third superconducting latch coupled between a corresponding second current source and a second end of the bidirectional current load, and a fourth superconducting latch coupled between the second end of the bidirectional current load and the low-voltage rail.

4. The circuit according to claim 3, wherein at least one of the plurality of superconducting bidirectional current drivers further comprises a shunt current path interconnecting a corresponding current source and the low-voltage rail, wherein the shunt current path is configured to provide a current path for a corresponding one of the first and second input currents in response to concurrent activation of the superconducting latches in a given one of the adjacent superconducting bidirectional current drivers.

5. The circuit according to claim 1, further comprising a reset latch interconnecting the bidirectional current load and a given one of the adjacent superconducting bidirectional current drivers, the reset latch being activated to return the given superconducting bidirectional current driver from a current state in which a corresponding input current is provided through the bidirectional current load to an idle state in which no current is provided through the bidirectional current load.

6. The circuit according to claim 1, wherein two adjacent superconducting bidirectional current drivers of the plurality of superconducting bidirectional current drivers are connected to form respective legs in an A-bridge circuit operatively coupled to the bidirectional current load, wherein the first superconducting latch circuit in a first adjacent superconducting bidirectional current driver comprises a first inductor operatively coupled between a corresponding first current source and a first end of the bidirectional current load, and a first superconducting latch coupled between the first end of the bidirectional current load and a low-voltage rail, and wherein the second superconducting latch circuit of a second adjacent bidirectional current driver comprises a second inductor coupled between a corresponding second current source and a second end of the bidirectional current load, and a second superconducting latch coupled between the second end of the bidirectional current load and the low-voltage rail.

7. The circuit according to claim 1, wherein each of the first and second current sources is configured as a flux shuttle loop current source configured to generate the first or second input current, respectively, in a corresponding storage inductor, the storage inductor being configured to provide the first or second input current to a corresponding one of the bidirectional current drivers.

8. A memory write driver comprising a bidirectional current driver circuit according to claim 1, wherein the bidirectional current load is configured as a bidirectional inductive current load that is inductively coupled to at least one of a row or a column of a memory array in which the memory write driver is operatively connected, wherein the bidirectional inductive current load is configured to provide a write current on a write line in a first direction to write a first memory state based on the input current being provided through the bidirectional inductive current load in the first direction, and to provide the write current on the write line in a second direction opposite the first direction to write a second memory state based on the input current being provided through the bidirectional inductive current load in the second direction.

9. A superconducting distributed bidirectional memory write current driver circuit for writing memory state to one or more selected memory cells in a memory array, the superconducting distributed bidirectional memory write current driver circuit comprising:
    a plurality of bidirectional write current drivers;
    at least first and second current sources configured to generate first and second input currents, respectively; and
    a first write line associated with at least one of a row or a column of the memory array and operatively coupled between two adjacent bidirectional write current drivers of the plurality of bidirectional write current drivers, the write line being configured to write a first memory state of at least one memory cell associated with the first write line as a function of the first input current being provided through the first write line in a first direction, and to write a second memory state of the at least one memory cell associated with the first write line as a function of the second input current being provided through the first write line in a second direction opposite the first direction,
    wherein each of the plurality of bidirectional write current drivers comprises:
        a first superconducting latch circuit configured to convey current through the first write line as a function of at least a first activation signal applied thereto; and
        a second superconducting latch circuit configured to convey current through a second write line associated with an adjacent one of the plurality of bidirectional write current drivers as a function of at least a second activation signal applied thereto;
        wherein the first superconducting latch circuit in a first one of the bidirectional current drivers operatively coupled to the first write line and the second superconducting latch circuit in a second one of the bidirectional current drivers operatively coupled to the first write line are selectively activated by the first and second activation signals, respectively, to establish a first current path of the first input current supplied to the first one of the bidirectional current drivers, through the first write line in the first direction, and
        wherein the second superconducting latch circuit in the second one of the bidirectional current drivers operatively coupled to the first write line and the first superconducting latch circuit in the first one of the bidirectional current drivers operatively coupled to the first write line are selectively activated by the second and first activation signals, respectively, to establish a second current path of the second input current supplied to the second one of the bidirectional current drivers, through the first write line in the second direction.

10. The circuit according to claim 9, wherein two adjacent bidirectional write current drivers of the plurality of bidirectional write current drivers are connected to form respective legs in an H-bridge circuit operatively coupled to the first write line, wherein the first superconducting latch circuit in a first adjacent bidirectional write current driver comprises a first superconducting latch operatively coupled between the first current source and a first end of the first write line, and a second superconducting latch coupled between the first end of the first write line and a low-voltage rail, and wherein the second superconducting latch circuit of a second adjacent bidirectional write current driver comprises a third superconducting latch coupled between the second current source and a second end of the first write line, and a fourth superconducting latch coupled between the second end of the first write line and the low-voltage rail.

11. The circuit according to claim 10, wherein at least one of the plurality of bidirectional write current drivers further comprises a shunt current path interconnecting a corresponding one of the first or second current sources and the low-voltage rail, wherein the shunt current path is configured to provide a current path for a corresponding one of the first and second input currents in response to concurrent activation of the superconducting latches in a given one of the adjacent bidirectional write current drivers.

12. The circuit according to claim 9, further comprising a reset latch interconnecting the first write line and a given one of the adjacent bidirectional write current drivers, the reset latch being activated to return the given bidirectional write current driver from a current state in which a corresponding input current is provided through the first write line to an idle state in which no current is provided through the first write line.

13. The circuit according to claim 9, wherein two adjacent bidirectional write current drivers of the plurality of bidirectional write current drivers are connected to form respective legs in an A-bridge circuit operatively coupled to the first write line, wherein the first superconducting latch circuit in a first adjacent bidirectional write current driver comprises a first inductor operatively coupled between the first current source and a first end of the first write line, and a first superconducting latch coupled between the first end of the first write line and a low-voltage rail, and wherein the second superconducting latch circuit of a second adjacent bidirectional write current driver comprises a second inductor coupled between the second current source and a second end of the first write line, and a second superconducting latch coupled between the second end of the first write line and the low-voltage rail.

14. A superconducting analog circuit, comprising:
    a plurality of superconducting distributed bidirectional current driver circuits, each of the plurality of superconducting distributed bidirectional current driver circuits is configured to generate a current in one of a first direction and a second direction, the second direction being opposite the first direction; and
    a time-division demultiplexing circuit operatively coupled to the plurality of superconducting distributed bidirectional current driver circuits, wherein the time-division demultiplexing circuit is configured such that a direction of the current generated by each of the plurality of superconducting distributed bidirectional current driver circuits is controlled as a function of a temporal sequence of data on a given data line in the superconducting analog circuit.

* * * * *

UNITED STATES PATENT AND TRADEMARK OFFICE
CERTIFICATE OF CORRECTION

PATENT NO. : 12,249,393 B2  Page 1 of 1
APPLICATION NO. : 17/993586
DATED : March 11, 2025
INVENTOR(S) : William Robert Reohr It is certified that error appears in the above-identified patent and that said Letters Patent is hereby corrected as shown below:

In the Specification

Column 4, Line 62: Please correct "7r-state" to read --π-state--

Column 22, Line 8: Please correct "<D" to read --Φ--

Column 22, Line 66: Please correct "Φ" to read -- -Φ--

Column 24, Line 67: Please correct "ACTS" to read --ACTs--

Signed and Sealed this
Fifth Day of August, 2025

Coke Morgan Stewart
*Acting Director of the United States Patent and Trademark Office*